United States Patent
Igarashi et al.

(10) Patent No.: US 12,362,023 B2
(45) Date of Patent: Jul. 15, 2025

(54) SEMICONDUCTOR MEMORY DEVICE

(71) Applicant: Kioxia Corporation, Tokyo (JP)

(72) Inventors: Hideki Igarashi, Kawasaki Kanagawa (JP); Tomokazu Nakai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 189 days.

(21) Appl. No.: 17/902,744

(22) Filed: Sep. 2, 2022

(65) Prior Publication Data

US 2023/0268012 A1 Aug. 24, 2023

(30) Foreign Application Priority Data

Feb. 21, 2022 (JP) ................................. 2022-024627

(51) Int. Cl.
 *G11C 16/14* (2006.01)
 *G06F 7/57* (2006.01)
 *G11C 16/34* (2006.01)

(52) U.S. Cl.
 CPC ............ *G11C 16/3445* (2013.01); *G06F 7/57* (2013.01); *G11C 16/14* (2013.01)

(58) Field of Classification Search
 CPC ................ G11C 16/3445; G11C 16/14; G11C 2211/5648; G11C 11/5635; G11C 11/5671; G11C 16/16; G11C 16/0483; G06F 7/57

See application file for complete search history.

(56) References Cited

U.S. PATENT DOCUMENTS

| | | | | |
|---|---|---|---|---|
| 7,633,804 B2* | 12/2009 | Nobunaga | ............. | G11C 16/10 |
| | | | | 365/185.23 |
| 8,873,293 B1* | 10/2014 | Ou | .................... | G11C 16/0483 |
| | | | | 365/185.17 |
| 9,466,379 B2* | 10/2016 | Lee | ......................... | G11C 16/12 |
| 9,922,714 B1* | 3/2018 | Yu | ........................... | G11C 16/14 |
| 10,438,673 B1* | 10/2019 | Chen | ..................... | G11C 16/16 |
| 2009/0238006 A1* | 9/2009 | Nobunaga | .......... | G11C 16/3445 |
| | | | | 365/185.29 |
| 2012/0269001 A1* | 10/2012 | Ueno | ..................... | G11C 16/16 |
| | | | | 365/185.22 |
| 2013/0080718 A1* | 3/2013 | Huh | ................... | G06F 12/0207 |
| | | | | 711/E12.001 |

(Continued)

FOREIGN PATENT DOCUMENTS

JP 2011192364 A 9/2011

*Primary Examiner* — Jay W. Radke
(74) *Attorney, Agent, or Firm* — Holtz, Holtz & Volek PC

(57) ABSTRACT

A semiconductor memory device performs: an erase voltage supply operation that applies an erase voltage to a first wiring; a first erase verify operation that applies a read pass voltage to a first conductive layer, and applies an erase verify voltage to a second conductive layer after performing the erase voltage supply operation; and a second erase verify operation that applies the erase verify voltage to the first conductive layer, and applies the read pass voltage to the second conductive layer after performing the first erase verify operation. The erase voltage increases by a first offset voltage in each erase loop from a first erase loop to an a-th erase loop, and the erase voltage increases by a second offset voltage in each erase loop from an a+1-th erase loop to a b-th erase loop. The second offset voltage is larger than the first offset voltage.

6 Claims, 24 Drawing Sheets

(56) References Cited

U.S. PATENT DOCUMENTS

| | | | |
|---|---|---|---|
| 2015/0228348 A1* | 8/2015 | Lee | G11C 16/16 |
| | | | 365/185.11 |
| 2016/0111165 A1* | 4/2016 | Shim | G11C 11/5635 |
| | | | 365/185.11 |
| 2016/0343444 A1* | 11/2016 | Park | G11C 16/3477 |
| 2019/0333589 A1* | 10/2019 | Chen | G11C 16/16 |
| 2021/0082531 A1 | 3/2021 | Shinohara et al. | |
| 2021/0142856 A1 | 5/2021 | Park et al. | |

* cited by examiner

FIG. 15

| WLeven | 1111 0111 1111 1110 |
|--------|---------------------|
| WLodd  | 1111 1111 1111 1110 |
| XOR    | 0000 1000 0000 0000 |

SEMICONDUCTOR MEMORY DEVICE

CROSS-REFERENCE TO RELATED APPLICATIONS

This application is based upon and claims the benefit of Japanese Patent Application No. 2022-024627, filed on Feb. 21, 2022, the entire contents of which are incorporated herein by reference.

BACKGROUND

Field

Embodiments described herein relate generally to a semiconductor memory device.

DESCRIPTION OF THE RELATED ART

There has been known a semiconductor memory device including a substrate, a plurality of first conductive layers arranged in a first direction intersecting with a substrate surface, and a semiconductor layer that extends in the first direction and is opposed to the plurality of first conductive layers.

BRIEF DESCRIPTION OF THE DRAWINGS

FIG. 15 is a drawing for describing a logical operation XOR;

DETAILED DESCRIPTION

Figure 1:
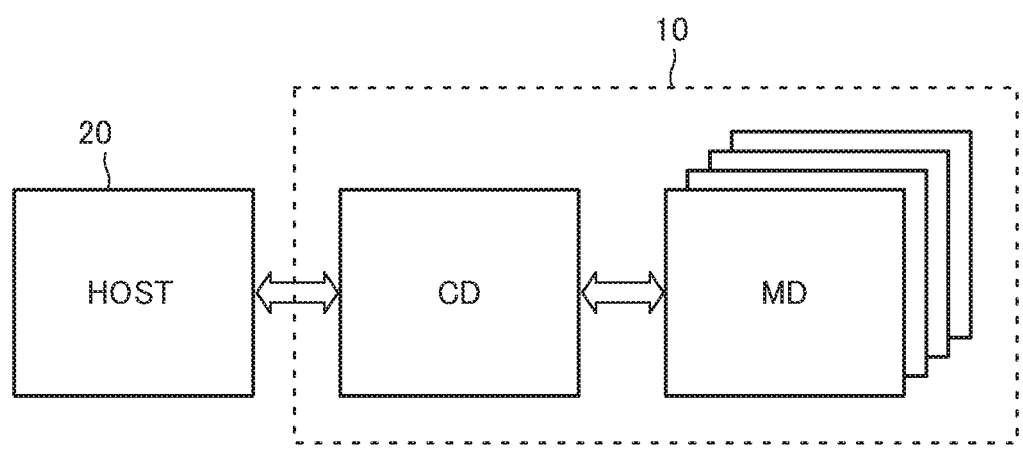
FIG. 1 is a schematic block diagram illustrating a configuration of a memory system 10.

A semiconductor memory device according to one embodiment comprises: a substrate; a plurality of conductive layers arranged in a first direction intersecting with a surface of the substrate; a first semiconductor layer that extends in the first direction and is opposed to the plurality of conductive layers; an electric charge accumulating layer disposed between the plurality of conductive layers and the first semiconductor layer; a first wiring connected to one end portion in the first direction of the first semiconductor layer; and a control circuit electrically connected to the plurality of conductive layers and the first wiring. The control circuit is configured to be able to perform an erase operation. The erase operation includes a plurality of erase loops. Each of the plurality of erase loops includes: an erase voltage supply operation that applies an erase voltage to the first wiring; a first erase verify operation that applies a read pass voltage smaller than the erase voltage to a first conductive layer as one of the plurality of conductive layers, and applies an erase verify voltage smaller than the read pass voltage to a second conductive layer as one of the plurality of conductive layers after performing the erase voltage supply operation; and a second erase verify operation that applies the erase verify voltage to the first conductive layer, and applies the read pass voltage to the second conductive layer after performing the first erase verify operation. The erase voltage increases by a first offset voltage in each erase loop from a first erase loop to an a-th erase loop, where a is an integer of 2 or more. The erase voltage increases by a second offset voltage in each erase loop from an a+1-th erase loop to a b-th erase loop, where b is an integer of a+2 or more. The second offset voltage is larger than the first offset voltage.

Next, the semiconductor memory devices according to embodiments are described in detail with reference to the drawings. The following embodiments are only examples, and not described for the purpose of limiting the present invention.

In this specification, when referring to a "semiconductor memory device", it may mean a memory die (memory chip) and may mean a memory system including a controller die, such as a memory card and a Solid State Drive (SSD).

Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Memory System 10]

FIG. 1 is a schematic block diagram illustrating a configuration of a memory system 10.

The memory system 10, for example, reads, writes, and erases user data according to a signal transmitted from a host computer 20. The memory system 10 is, for example, any system that can store the user data, such as a memory chip, a memory card, or an SSD. The memory system 10 includes a plurality of memory dies MD that store the user data and a controller die CD connected to these plurality of memory dies MD and the host computer 20. The controller die CD includes, for example, a processor, a RAM, a ROM, an ECC circuit, and the like, and performs processing, such as conversion between a logical address and a physical address, bit error detection/correction, and a wear leveling.

[Configuration of Memory Die MD]

Figure 2:
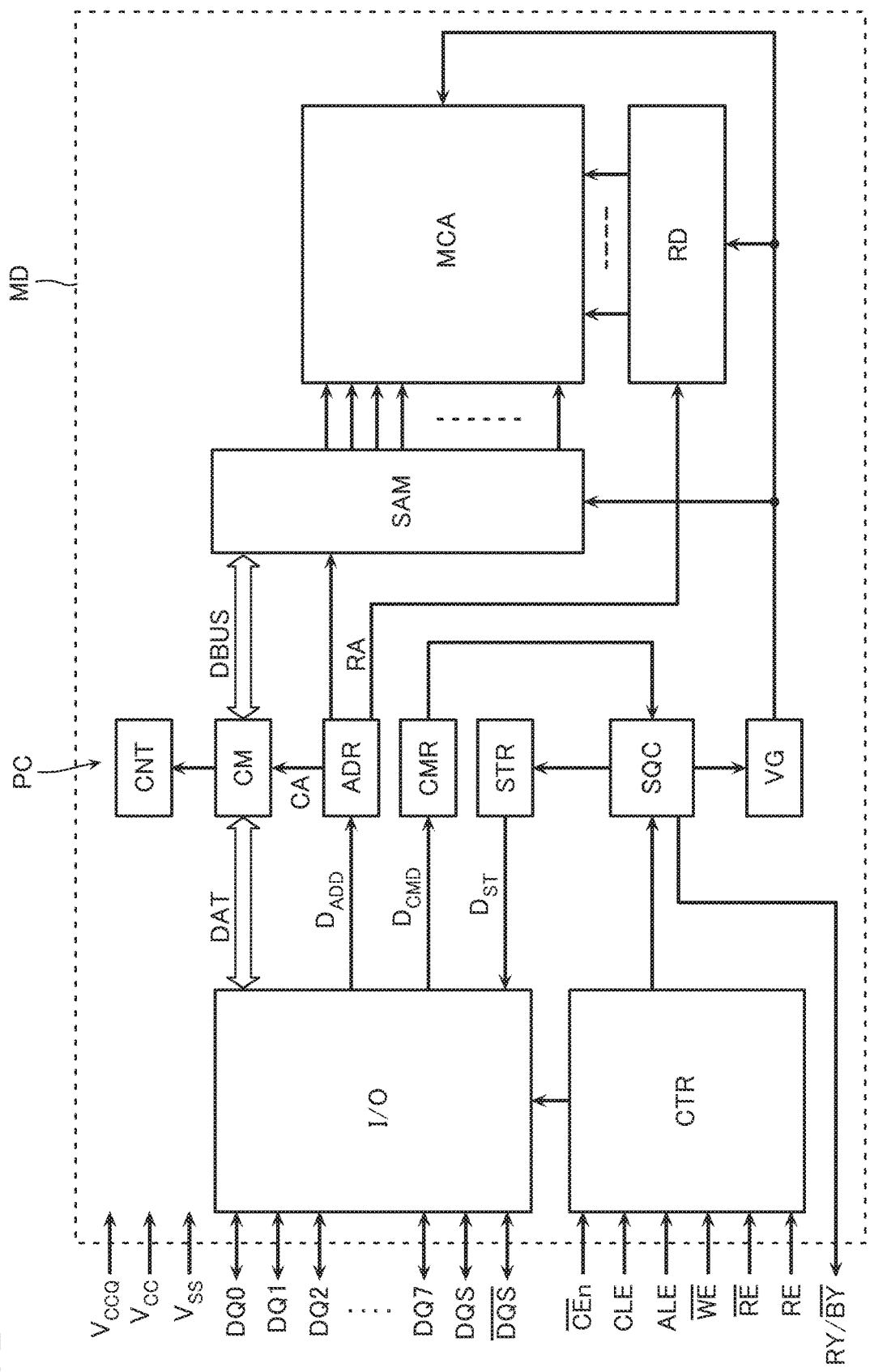
FIG. 2 is a schematic block diagram illustrating a configuration of a memory die MD according to a first embodiment.
Figure 3:
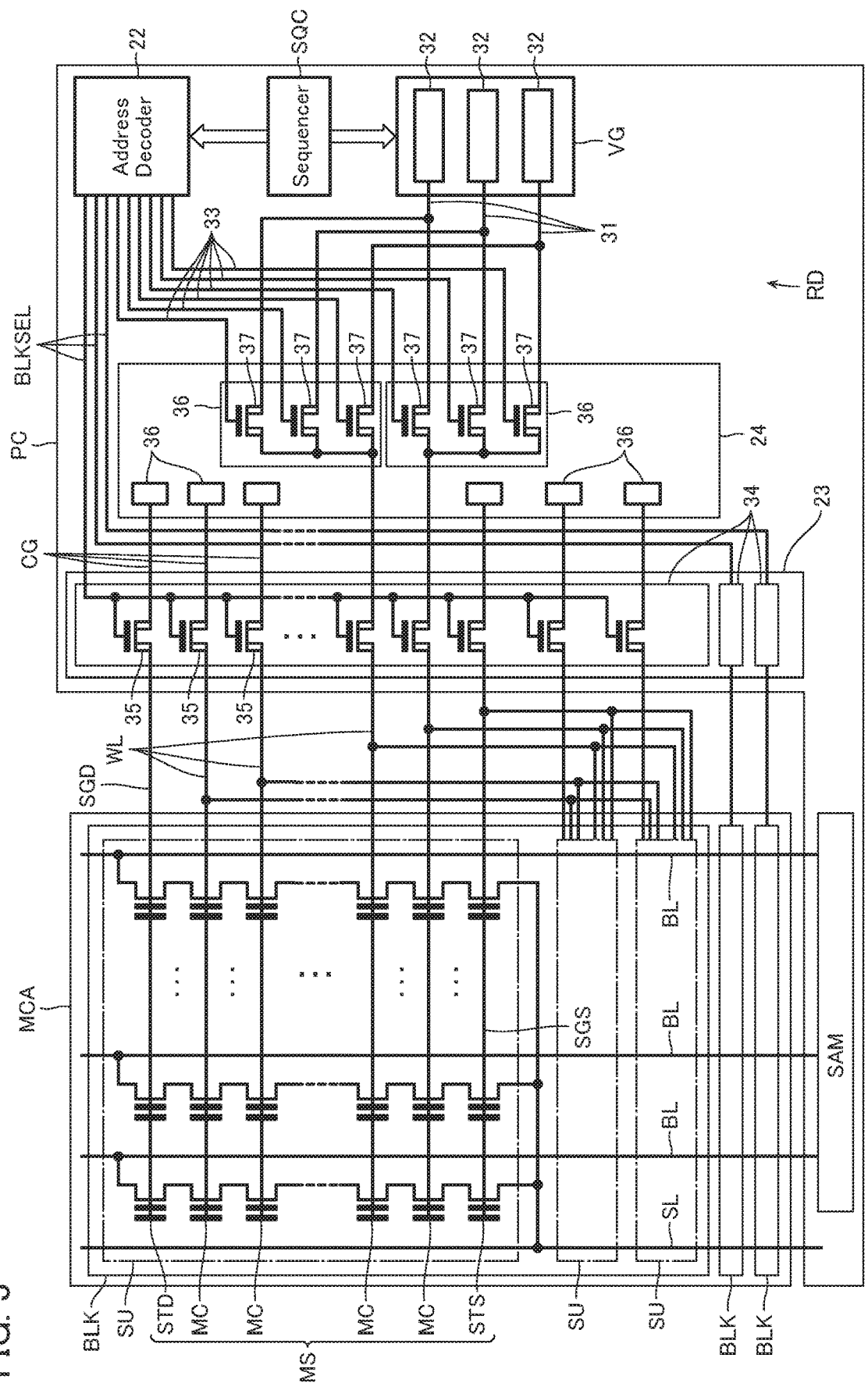
FIG. 3 is a schematic circuit diagram illustrating a part of the configuration of the memory die MD.
Figure 4:
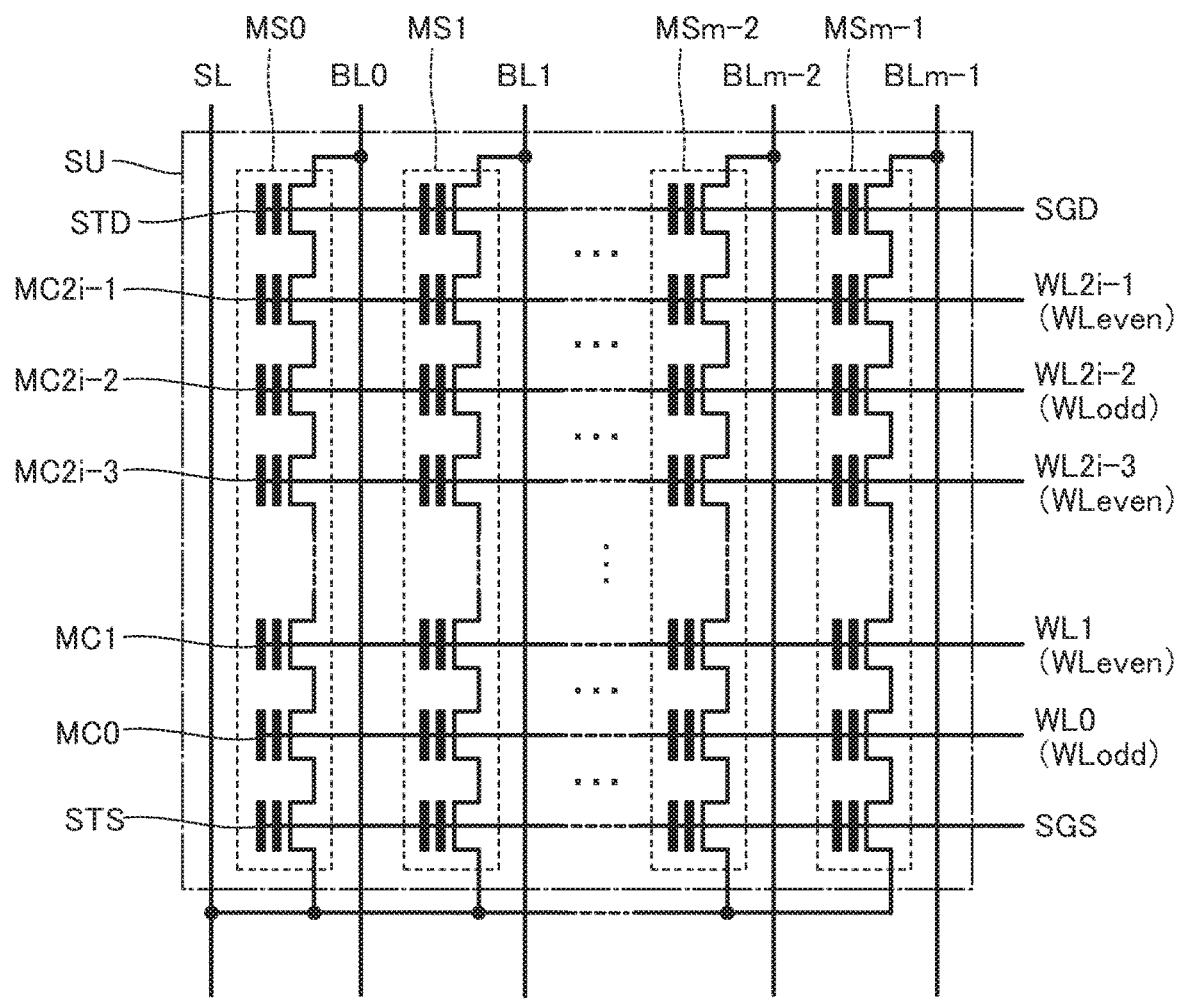
FIG. 4 is a schematic circuit diagram illustrating a configuration of a string unit SU of FIG. 3.
Figure 5:
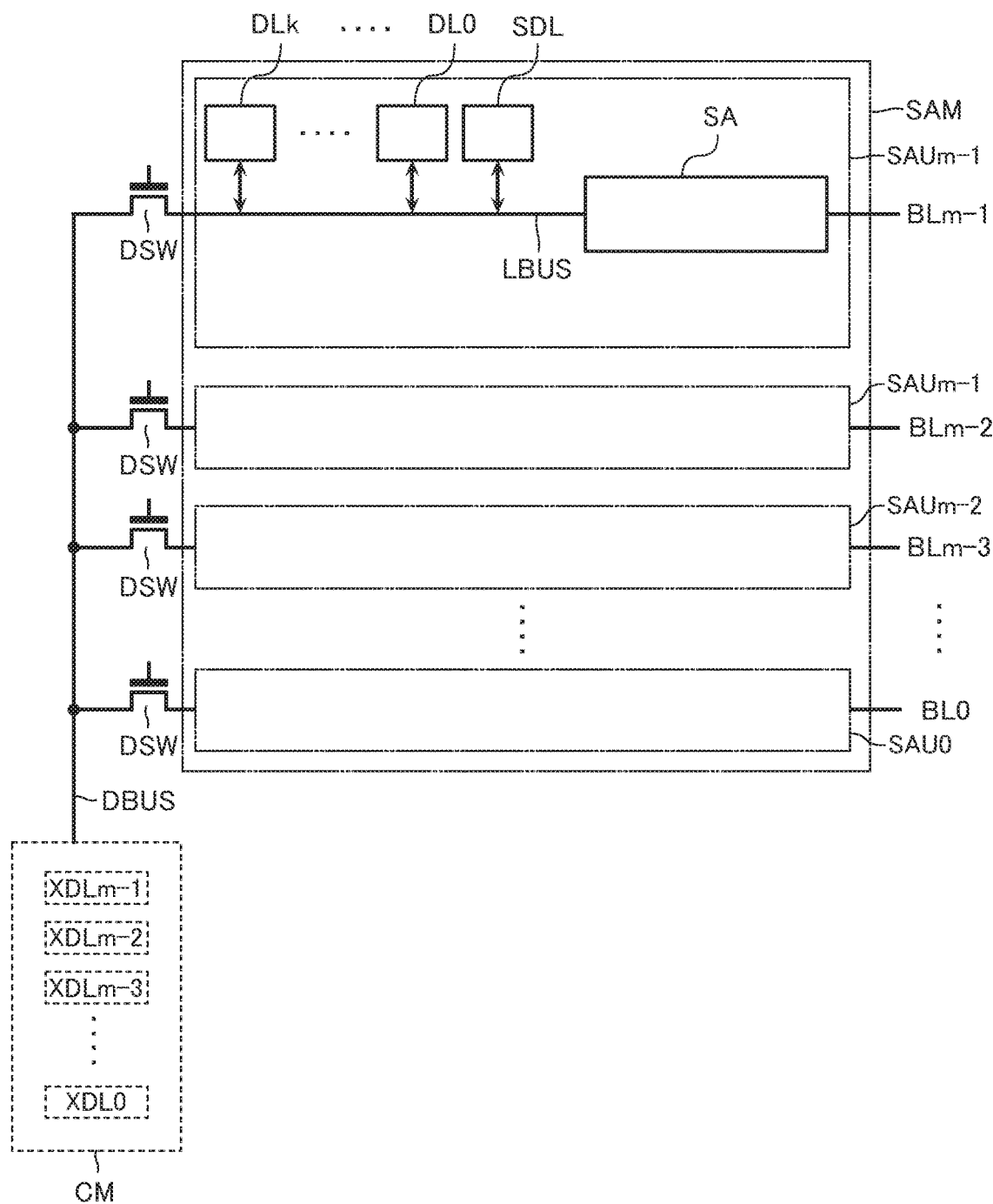
FIG. 5 is a schematic block diagram illustrating a configuration of a sense amplifier module SAM.

FIG. 2 is a schematic block diagram illustrating a configuration of the memory die MD according to the first embodiment. FIG. 3 is a schematic circuit diagram illustrating a part of the configuration of the memory die MD. FIG. 4 is a schematic circuit diagram illustrating a configuration of a string unit SU of FIG. 3. FIG. 5 is a schematic block diagram illustrating a configuration of a sense amplifier module SAM.

FIG. 2 illustrates a plurality of control terminals and the like. These plurality of control terminals are represented as control terminals corresponding to a high active signal (a positive logic signal) in some cases, represented as control terminals corresponding to a low active signal (a negative logic signal) in some cases, and represented as control terminals corresponding to both the high active signal and the low active signal in some cases. In FIG. 2, a reference sign of the control terminal corresponding to the low active signal includes an over line (overbar). In this specification, a reference sign of the control terminal corresponding to the low active signal includes a slash ("/").

The description of FIG. 2 is an example, and specific aspects are appropriately adjustable. For example, a part of or all of the high active signals can be changed to the low active signals, or a part of or all of the low active signals can be changed to the high active signals. Additionally, a terminal RY/(/BY) described later outputs a ready signal as the high active signal and a busy signal as the low active signal. The slash ("/") between RY and (/BY) indicates a break between the ready signal and the busy signal.

As illustrated in FIG. 2, the memory die MD includes a memory cell array MCA storing data and a peripheral circuit PC connected to the memory cell array MCA.

[Circuit Configuration of Memory Cell Array MCA]

As illustrated in FIG. 3, the memory cell array MCA includes a plurality of memory blocks BLK. Each of these plurality of memory blocks BLK includes a plurality of string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL.

The memory string MS includes a drain-side select transistor STD, a plurality of memory cells MC (memory cell transistors), and a source-side select transistor STS, which are connected in series between the bit line BL and the source line SL. Hereinafter, the drain-side select transistor STD and the source-side select transistor STS are simply referred to as select transistors (STD, STS) in some cases.

The memory cell MC is a field-effect type transistor (memory transistor) that includes a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC usually stores data of one bit or a plurality of bits. Respective word lines WL are connected to the gate electrodes of the plurality of memory cells MC corresponding to one memory string MS. Each of these word lines WL is connected to all the memory strings MS in one memory block BLK in common.

The select transistors (STD, STS) are field-effect type transistors that each include a semiconductor layer, a gate insulating film, and a gate electrode. The semiconductor layer functions as a channel region. A drain-side select gate line SGD and a source-side select gate line SGS are connected to gate electrodes of the select transistors (STD, STS), respectively. The drain-side select gate line SGD is disposed corresponding to the string unit SU and is connected in common to all the memory strings MS in one string unit SU. The source-side select gate line SGS is connected in common to all the memory strings MS in the memory block BLK. Hereinafter, the drain-side select gate line SGD and the source-side select gate line SGS are simply referred to as select gate lines (SGD, SGS) in some cases.

[Counts of Word Lines WL and Bit Lines BL in String Unit SU]

As illustrated in FIG. 4, the string unit SU according to the embodiment is connected to the 2i word lines WL0 to WL2$i$−1. i is an integer of 1 or more. The 2i word lines WL0 to WL2$i$−1 are the first to the 2i-th word lines WL counting from the source-side select gate line SGS in a direction of the drain-side select gate line SGD. The 2i word lines WL0 to WL2$i$−1 are connected to the gate electrodes of the first to the 2i-th memory cells MC0 to MC2$i$−1 in the memory string MS, respectively.

Among the 2i word lines WL0 to WL2$i$−1, an odd-numbered word lines WL0, WL2, . . . , and WL2$i$−2 are referred to as word lines WLodd in some cases. Among the 2i word lines WL0 to WL2$i$−1, an even-numbered word lines WL1, WL3, . . . , WL2$i$−3, and WL2$i$−1 are referred to as word lines WLeven in some cases.

As illustrated in FIG. 4, the string unit SU according to the embodiment is connected to the m bit lines BL0 to BLm−1. m is an integer of 1 or more. The m bit lines BL0 to BLm−1 are connected to the first to the m-th memory strings MS0 to MSm−1 in the string unit SU, respectively.

[Circuit Configuration of Peripheral Circuit PC]

As illustrated in FIG. 2, the peripheral circuit PC includes a row decoder RD, a sense amplifier module SAM, a cache memory CM, a counter CNT, a voltage generation circuit VG, and a sequencer SQC. The peripheral circuit PC includes an address register ADR, a command register CMR, and a status register STR. The peripheral circuit PC includes an input/output control circuit I/O and a logic circuit CTR.

[Configuration of Row Decoder RD]

For example, as illustrated in FIG. 3, the row decoder RD (FIG. 2) includes an address decoder 22 that decodes address data $D_{ADD}$ (FIG. 2). The row decoder RD (FIG. 2) includes a block select circuit 23 and a voltage select circuit 24 that transfer an operating voltage to the memory cell array MCA according to an output signal from the address decoder 22.

The address decoder 22 is connected to a plurality of block select lines BLKSEL and a plurality of voltage select lines 33. For example, the address decoder 22 sequentially refers to a row address RA in the address register ADR (FIG. 2) in response to a control signal from the sequencer SQC (FIG. 2).

The block select circuit 23 includes a plurality of block select circuits 34 corresponding to the memory blocks BLK. The block select circuits 34 each include a plurality of block select transistors 35 corresponding to the word lines WL and the select gate lines (SGD, SGS).

The block select transistor 35 is, for example, a field-effect type high breakdown voltage transistor. The block select transistors 35 have drain electrodes each electrically connected to the corresponding word line WL or the select gate line (SGD, SGS). The source electrodes of the block select transistors 35 are each electrically connected to a voltage supply line 31 via a wiring CG and the voltage select circuit 24. The gate electrodes of the block select transistors 35 are connected in common to the corresponding block select line BLKSEL.

The voltage select circuit 24 includes a plurality of voltage selectors 36 corresponding to the word lines WL and the select gate line (SGD, SGS). Each of these plurality of voltage selectors 36 includes a plurality of voltage select transistors 37. The voltage select transistor 37 is, for example, a field-effect type high breakdown voltage transistor. The voltage select transistors 37 have drain terminals each electrically connected to the corresponding word line WL or the select gate line (SGD, SGS) via the wiring CG and the block select circuit 23. Each of the source terminals is electrically connected to the corresponding voltage supply line 31. Each of the gate electrodes is connected to the corresponding voltage select line 33.

[Configurations of Sense Amplifier Module SAM and Cache Memory CM]

As illustrated in FIG. 5, the sense amplifier module SAM includes a plurality of sense amplifier units SAU0 to SAUm−1 corresponding to the plurality of bit lines BL0 to BLm−1. Each of the plurality of sense amplifier units SAU0 to SAUm−1 includes a sense amplifier SA connected to corresponding one of the bit lines BL0 to BLm−1, a wiring LBUS connected to the sense amplifier SA, and latch circuits SDL and DL0 to DLk connected to the wiring LBUS. k is an integer of 1 or more.

The sense amplifier SA senses data read from the memory cell MC. The latch circuits SDL and DL0 to DLk temporarily store the data sensed by the sense amplifier SA. The wiring LBUS is connected to a wiring DBUS via a switch transistor DSW.

As illustrated in FIG. 5, the cache memory CM is connected to the wiring DBUS. The cache memory CM includes a plurality of latch circuits XDL0 to XDLm−1 corresponding to the plurality of sense amplifier units SAU0 to SAUm−1. Each of the plurality of latch circuits XDL0 to XDLm−1 stores the data written in the memory cell MC or the data read from the memory cell MC.

Data DAT included in these plurality of latch circuits XDL0 to XDLm−1 are sequentially transferred to the latch circuits in the sense amplifier modules SAM during a write operation. The data included in the latch circuits SDL and DL0 to DLk in the sense amplifier modules SAM are sequentially transferred to the latch circuits XDL0 to XDLm−1 during a read operation and a verify operation. The data DAT included in the latch circuits XDL0 to XDLm−1 are sequentially transferred to the input/output control circuit I/O during a data-out operation.

[Configuration of Counter CNT]

The counter CNT (FIG. 2) counts the number of bits of "0" or bits of "1" in the data sequentially transferred from the latch circuits XDL0 to XDLm−1 of the cache memory CM in response to the control signal from the sequencer SQC during the verify operation and the like.

[Configuration of Voltage Generation Circuit VG]

For example, as illustrated in FIG. 3, the voltage generation circuit VG (FIG. 2) is connected to a plurality of the voltage supply lines 31. The voltage generation circuit VG includes, for example, a step down circuit, such as a regulator, and a step up circuit, such as a charge pump circuit 32. These step down circuit and step up circuit are each connected to the voltage supply line to which a power supply voltage $V_{CC}$ and a ground voltage $V_{SS}$ (FIG. 2) are applied. For example, the voltage generation circuit VG generates a plurality of operating voltages applied to the bit line BL, the source line SL, the word line WL, and the select gate lines (SGD, SGS) in the read operation, the write operation, and the erase operation on the memory cell array MCA in response to the control signal from the sequencer SQC, and simultaneously outputs the operating voltages to the plurality of voltage supply lines 31. The operating voltage output from the voltage supply line 31 is appropriately adjusted in response to the control signal from the sequencer SQC.

[Configuration of Sequencer SQC]

In accordance with command data $D_{CMD}$ stored in the command register CMR, the sequencer SQC (FIG. 2) outputs an internal control signal to the row decoder RD, the sense amplifier module SAM, and the voltage generation circuit VG. The sequencer SQC appropriately outputs status data $D_{ST}$ indicative of the state of the memory die MD to the status register STR.

The sequencer SQC generates a ready/busy signal and outputs it to the terminal RY/(/BY). In a period when the terminal RY/(/BY) is in a "L" state (a busy period), access to the memory die MD is basically inhibited. In a period when the terminal RY/(/BY) is in a "H" state (a ready period), access to the memory die MD is permitted.

[Configuration of Address Register ADR]

As illustrated in FIG. 2, the address register ADR is connected to the input/output control circuit I/O and stores the address data $D_{ADD}$ input from the input/output control circuit I/O. For example, the address register ADR includes a plurality of 8-bit register strings. For example, when an internal operation, such as the read operation, the write operation, or the erase operation is performed, the register string latches the address data $D_{ADD}$ corresponding to the internal operation in execution.

The address data $D_{ADD}$, for example, includes a column address CA (FIG. 2) and the row address RA (FIG. 2). For example, the row address RA includes a block address to identify the memory block BLK (FIG. 3), a page address to identify the string unit SU and the word line WL, a plane address to identify the memory cell array MCA (plane), and a chip address to identify the memory die MD.

[Configuration of Command Register CMR]

The command register CMR is connected to the input/output control circuit I/O and stores the command data $D_{CMD}$ input from the input/output control circuit I/O. For example, the command register CMR includes at least one set of an 8-bit register string. When the command data $D_{CMD}$ is stored in the command register CMR, the control signal is transmitted to the sequencer SQC.

[Configuration of Status Register SIR]

The status register STR is connected to the input/output control circuit I/O and stores the status data $D_{ST}$ output to the input/output control circuit I/O. For example, the status register STR includes a plurality of 8-bit register strings. For example, when the internal operation, such as the read operation, the write operation, or the erase operation is performed, the register string latches the status data $D_{ST}$ regarding the internal operation in execution. The register string, for example, latches ready/busy information of the memory cell array MCA.

[Configuration of Input/Output Control Circuit I/O]

The input/output control circuit I/O (FIG. 2) includes data signal input/output terminals DQ0 to DQ7, data strobe signal input/output terminals DQS, /DQS, a shift register, and a buffer circuit.

The data input via the data signal input/output terminals DQ0 to DQ7 is input to the cache memory CM, the address register ADR, or the command register CMR from the buffer circuit in response to the internal control signal from the logic circuit CTR. The data output via the data signal input/output terminals DQ0 to DQ7 is input to the buffer circuit from the cache memory CM or the status register STR in response to the internal control signal from the logic circuit CTR.

The signals input via the data strobe signal input/output terminals DQS, /DQS (for example, a data strobe signal and its complementary signal) are used at data input via the data signal input/output terminals DQ0 to DQ7. The data input via the data signal input/output terminals DQ0 to DQ7 are taken in the shift register in the input/output control circuit I/O at a timing of a voltage rise edge (switching of the input signal) of the data strobe signal input/output terminal DQS and a voltage fall edge (switching of the input signal) of the data strobe signal input/output terminal /DQS, and at a timing of a voltage fall edge (switching of the input signal) of the data strobe signal input/output terminal DQS and a voltage rise edge (switching of the input signal) of the data strobe signal input/output terminal /DQS.

[Configuration of Logic Circuit CTR]

The logic circuit CTR (FIG. 2) includes a plurality of external control terminals /CEn, CLE, ALE, /WE, /RE, RE and a logic circuit connected to these plurality of external control terminals /Cen, CLE, ALE, /WE, /RE, RE. The logic circuit CTR receives an external control signal from the controller die CD via the external control terminals /CEn, CLE, ALE, /WE, /RE, RE and outputs the internal control signal to the input/output control circuit I/O in response to this.

[Structure of Memory Die MD]

Figure 6:
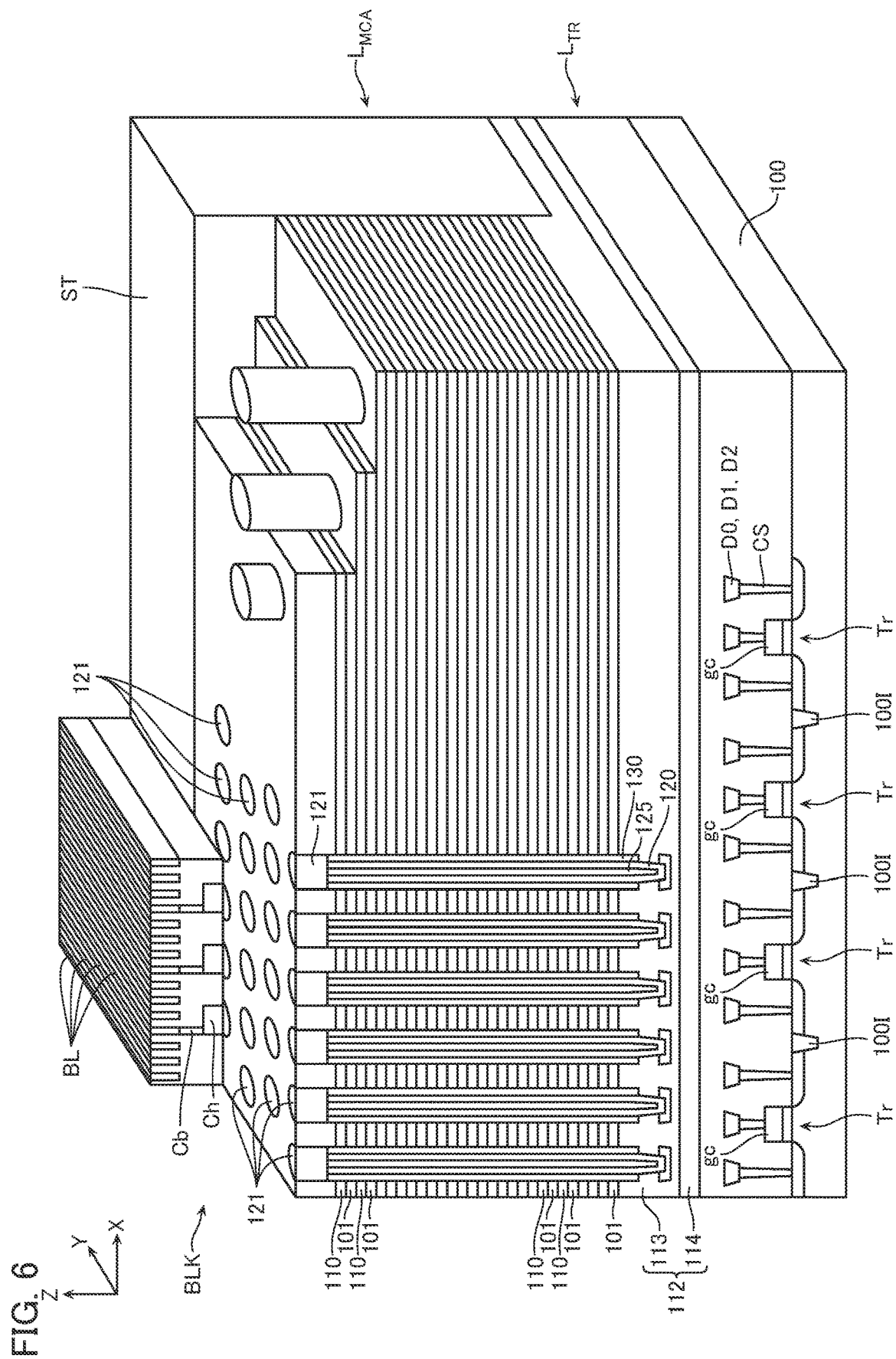
FIG. 6 is a schematic perspective view illustrating a part of the configuration of the memory die MD.
Figure 7:
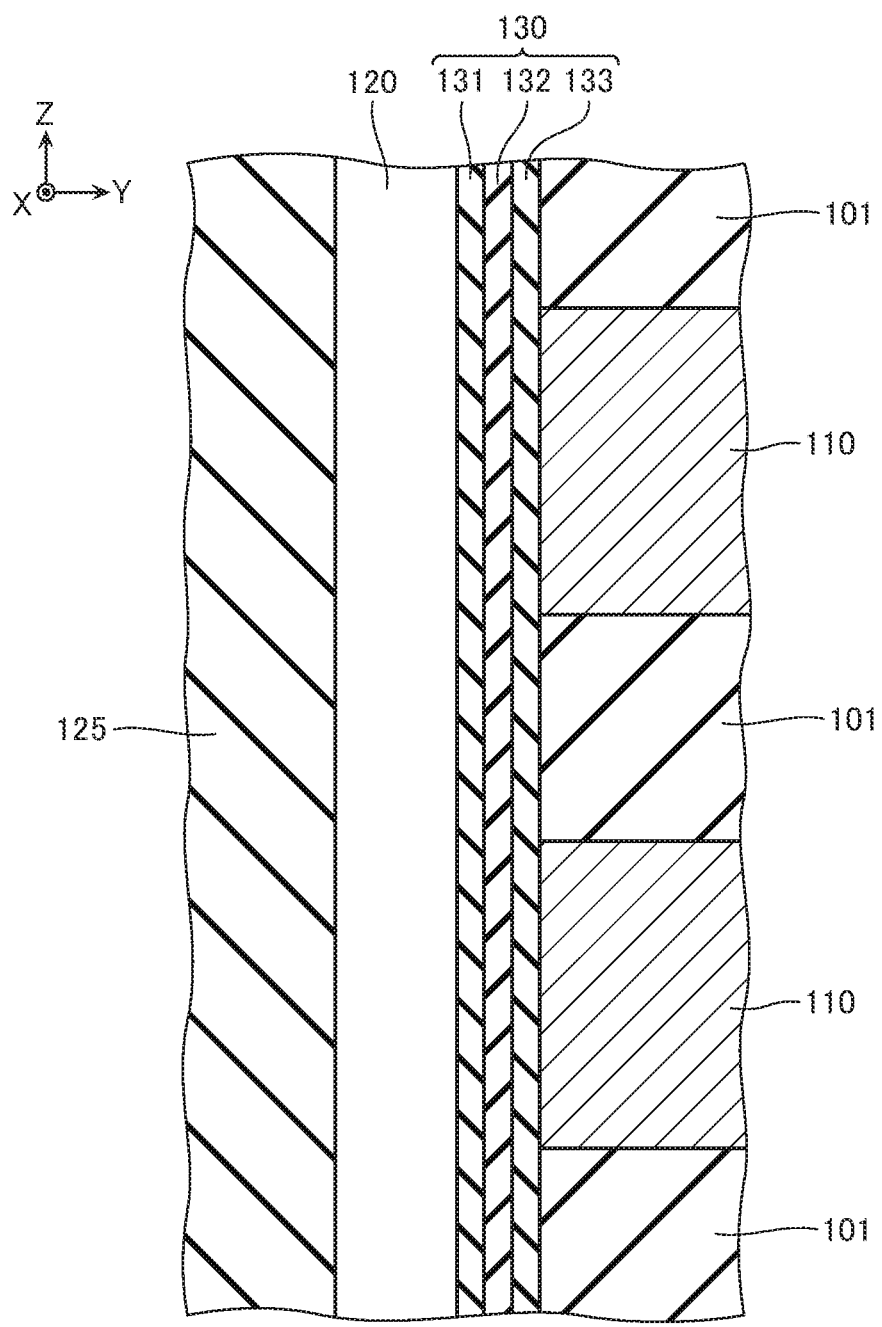
FIG. 7 is a schematic enlarged view illustrating a part of the configuration of FIG. 6.

FIG. 6 is a schematic perspective view illustrating a part of the configuration of the memory die MD. FIG. 7 is a schematic enlarged view illustrating a part of the configuration of FIG. 6. FIG. 6 and FIG. 7 illustrate schematic configurations, and specific configurations can be changed as necessary. In FIG. 6 and FIG. 7, the configurations are partially omitted.

As illustrated in FIG. 6, the memory die MD includes a semiconductor substrate 100, a transistor layer $L_{TR}$ disposed on the semiconductor substrate 100, and a memory cell array layer $L_{MCA}$ disposed above the transistor layer $L_{TR}$.

[Structure of Semiconductor Substrate 100]

For example, the semiconductor substrate 100 includes single-crystal silicon (Si) or the like containing P-type impurities. On a part of a surface of the semiconductor substrate 100, an N-type well containing N-type impurities, such as phosphorus (P), is disposed. On a part of a surface of the N-type well, a P-type well containing P-type impurities, such as boron (B), is disposed. On a part of the surface of the semiconductor substrate 100, an insulating region 1001 is disposed.

[Structure of Transistor Layer $L_{TR}$]

The transistor layer $L_{TR}$ includes a plurality of transistors Tr constituting the peripheral circuit PC. A source region, a drain region, and a channel region of the transistor Tr are disposed on the surface of the semiconductor substrate 100. The transistor Tr includes a gate electrode gc disposed in the transistor layer $L_{TR}$. At the source regions, the drain regions, and the gate electrodes gc of these plurality of transistors Tr, contacts CS are disposed. These plurality of contacts CS are connected to other transistors Tr, the configurations in the memory cell array layer $L_{MCA}$, and the like via wirings D0, D1, and D2 in the transistor layer $L_{TR}$.

[Structure of Memory Cell Array Layer $L_{MCA}$]

The memory cell array layer $L_{MCA}$ includes a plurality of memory blocks BLK and a plurality of inter-block structures ST alternately arranged in the Y-direction. The memory block BLK includes a plurality of conductive layers 110 and a plurality of insulating layers 101 alternately arranged in the Z-direction, a plurality of semiconductor columns 120 extending in the Z-direction, and a plurality of gate insulating films 130 each disposed between the plurality of conductive layers 110 and the plurality of semiconductor columns 120.

The conductive layer 110 is an approximately plate-shaped conductive layer extending in the X-direction, and a plurality of the conductive layers 110 are arranged in the Z-direction. The conductive layer 110 may include, for example, a stacked film of titanium nitride (TiN) and tungsten (W), and may contain polycrystalline silicon or the like containing impurities such as phosphorus or boron.

Among the plurality of conductive layers 110, one or a plurality of conductive layers 110 positioned at the lowermost layer function as the source-side select gate lines SGS (FIG. 3) and gate electrodes of the plurality of source-side select transistors STS connected to the source-side select gate lines SGS. A plurality of conductive layers 110 positioned thereabove function as the word lines WL (FIG. 3) and gate electrodes of the plurality of memory cells MC (FIG. 3) connected to the word lines WL. One or a plurality of conductive layers 110 positioned thereabove function as the drain-side select gate line SGD and gate electrodes of the plurality of drain-side select transistors STD (FIG. 3) connected to the drain-side select gate line SGD.

A conductive layer 112 is disposed below the conductive layers 110. The conductive layer 112 includes a semiconductor layer 113 connected to lower ends of the semiconductor columns 120, and a conductive layer 114 connected to a lower surface of the semiconductor layer 113. The semiconductor layer 113 may contain, for example, polycrystalline silicon containing impurities such as phosphorus (P) or boron (B). The conductive layer 114 may include, for example, a metal, such as tungsten (W), a conductive material, such as tungsten silicide, or another conductive material. An insulating layer 101 of silicon oxide ($SiO_2$) or the like is disposed between the conductive layer 112 and the conductive layer 110.

The conductive layer 112 functions as a source line SL (FIG. 3). The source line SL is disposed, for example, in common to all of the memory blocks BLK included in the memory cell array MCA (FIG. 3).

A plurality of the semiconductor columns 120 are arranged in the X-direction and the Y-direction. The semiconductor column 120 is, for example, a semiconductor film of non-doped polycrystalline silicon (Si) or the like. The semiconductor column 120 has an approximately cylindrical shape, and includes an insulating film 125 of silicon oxide or the like in the center portion. Each of the semiconductor columns 120 has an outer peripheral surface surrounded by the conductive layers 110. A lower end portion of the semiconductor column 120 is connected to the semiconductor layer 113 of the conductive layer 112. An upper end portion of the semiconductor column 120 is connected to the bit line BL via an impurity region 121 containing N-type impurities such as phosphorus (P) and contacts Ch, Cb. The respective semiconductor columns 120 function as the channel regions of the plurality of memory cells MC and the select transistors STD, STS included in one memory string MS (FIG. 3).

For example, as illustrated in FIG. 7, the gate insulating film 130 includes a tunnel insulating film 131, an electric charge accumulating film 132, and a block insulating film 133 stacked between the semiconductor column 120 and the conductive layers 110. The tunnel insulating film 131 and the block insulating film 133 are, for example, insulating films of silicon oxide or the like. The electric charge accumulating film 132 is, for example, a film of silicon nitride (SiN) or the like that can accumulate an electric charge. The tunnel insulating film 131, the electric charge accumulating film 132, and the block insulating film 133 each have an approximately cylindrical shape, and extend in the Z-direction along the outer peripheral surface of the semiconductor column 120.

While FIG. 7 illustrates an example in which the gate insulating film 130 includes the electric charge accumulating film 132 of silicon nitride or the like, the gate insulating film 130 may include, for example, a floating gate of polycrystalline silicon or the like containing N-type or P-type impurities.

For example, as illustrated in FIG. 6, the inter-block structure ST extends in the X-direction and the Z-direction. For example, the inter-block structure ST may include an insulating layer of silicon oxide ($SiO_2$) or the like. The inter-block structure ST may include, for example, a conductive layer that extends in the X-direction and the Z-direction and is connected to the conductive layer 112, and insulating layers of silicon oxide ($SiO_2$) or the like disposed on both side surfaces in the Y-direction of this conductive layer.

[Threshold Voltage of Memory Cell MC Storing a Plurality of Bits]

Figures 8A, 8B, 8C:
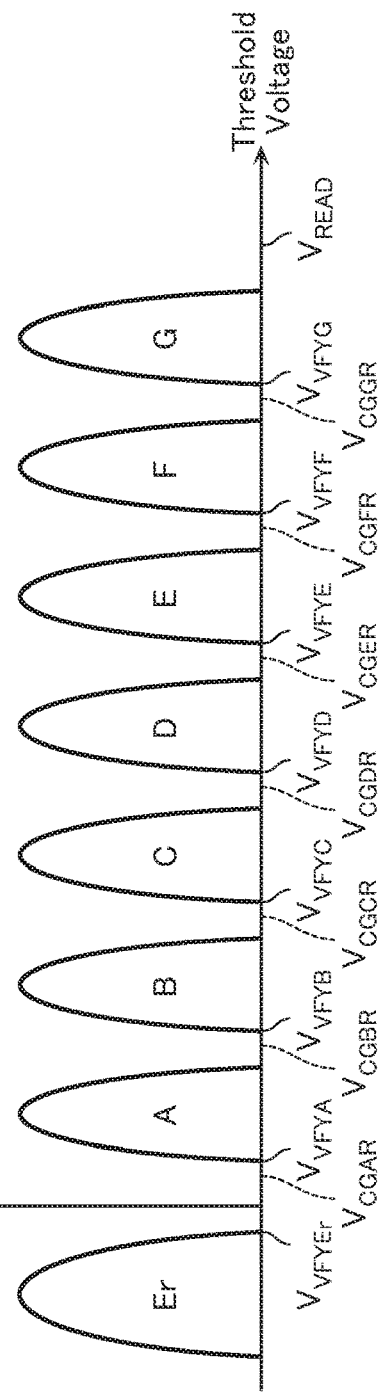
FIG. 8A is a schematic histogram for describing a threshold voltage of a memory cell MC storing 3-bit data.
FIG. 8B is a table showing an example of a relation between the threshold voltage of the memory cell MC storing the 3-bit data and the stored data.
FIG. 8C is a table showing another example of the relation between the threshold voltage of the memory cell MC storing the 3-bit data and the stored data.

Next, with reference to FIG. 8A to FIG. 8C, the threshold voltage of the memory cell MC storing data of a plurality of bits will be described. FIG. 8A illustrates the threshold voltage of the memory cell MC storing three-bit data as an example.

FIG. 8A is a schematic histogram for describing the threshold voltage of the memory cell MC storing the 3-bit data. The horizontal axis indicates the voltage of the word line WL, and the vertical axis indicates the number of memory cells MC. FIG. 8B is a table showing an example of a relation between the threshold voltage of the memory cell MC storing the 3-bit data and the stored data. FIG. 8C is a table showing another example of the relation between the threshold voltage of the memory cell MC storing the 3-bit data and the stored data.

In the example of FIG. 8A, the threshold voltages of the memory cells MC are controlled in eight states. The threshold voltage of the memory cell MC controlled in a state Er is smaller than an erase verify voltage $V_{VFYEr}$. For example, the threshold voltage of the memory cell MC controlled in a state A is larger than a verify voltage $V_{VFYA}$ and smaller than a verify voltage $V_{VFYB}$. Additionally, for example, the threshold voltage of the memory cell MC controlled in a state B is larger than the verify voltage $V_{VFYB}$ and smaller than a verify voltage $V_{VFYC}$. Hereinafter, similarly, the threshold voltages of the memory cells MC controlled in a state C to a state F are larger than the verify voltage $V_{VFYC}$ to a verify voltage $V_{VFYF}$ and smaller than a verify voltage $V_{VFYD}$ to a verify voltage $V_{VFYG}$, respectively. For example, the threshold voltage of the memory cell MC controlled in a state G is larger than the verify voltage $V_{VFYG}$ and smaller than a read pass voltage $V_{READ}$.

In the example in FIG. 8A, a read voltage $V_{CGAR}$ is set in a range between a threshold distribution corresponding to the state Er and a threshold distribution corresponding to the state A. A read voltage $V_{CGBR}$ is set in a range between the threshold distribution corresponding to the state A and a threshold distribution corresponding to the state B. The same applies to the following, and a read voltage $V_{CGCR}$ to a read voltage $V_{CGGR}$ are respectively set in ranges from a range between a threshold distribution corresponding to the state B and a threshold distribution corresponding to the state C to a range between a threshold distribution corresponding to the state F and a threshold distribution corresponding to the state G.

For example, the state Er corresponds to the lowest threshold voltage. The memory cell MC in the state Er is, for example, in an erase state. For example, data "111" is assigned to the memory cell MC in the state Er.

The state A corresponds to the threshold voltage higher than the threshold voltage corresponding to the state Er. For example, data "101" is assigned to the memory cell MC in the state A.

The state B corresponds to the threshold voltage higher than the threshold voltage corresponding to the state A. For example, data "001" is assigned to the memory cell MC in the state B.

Hereinafter, similarly, the state C to the state G in the drawing correspond to threshold voltages higher than the threshold voltages corresponding to the state B to the state F. For example, data "011", "010", "110", "100", and "000" are assigned to the memory cells MC in these states.

In the case of the assignment as exemplified in FIG. 8B, the data of a lower bit is distinguishable with one read voltage $V_{CGDR}$. The data of a middle bit is distinguishable with three read voltages $V_{CGAR}$, $V_{CGCR}$, $V_{CGFR}$. The data of an upper bit is distinguishable with three read voltages $V_{CGBR}$, $V_{CGER}$, $V_{CGGR}$. This assignment of data is referred to as a 1-3-3 code in some cases.

The number of bits of the data stored in the memory cell MC, the number of states, the assignment of the data to each state, and the like are changeable as necessary.

For example, in the case of the assignment as exemplified in FIG. 8C, the data of the lower bit is distinguishable with one read voltage $V_{CGDR}$. The data of the middle bit is distinguishable with the two read voltages $V_{CGBR}$, $V_{CGFR}$. The data of the upper bit is distinguishable with the four read voltages $V_{CGAR}$, $V_{CGCR}$, $V_{CGER}$, $V_{CGGR}$. This assignment of data is referred to as a 1-2-4 code in some cases.

[Erase Operation]

Next, the erase operation of the semiconductor memory device according to the embodiment will be described.

Figure 9:
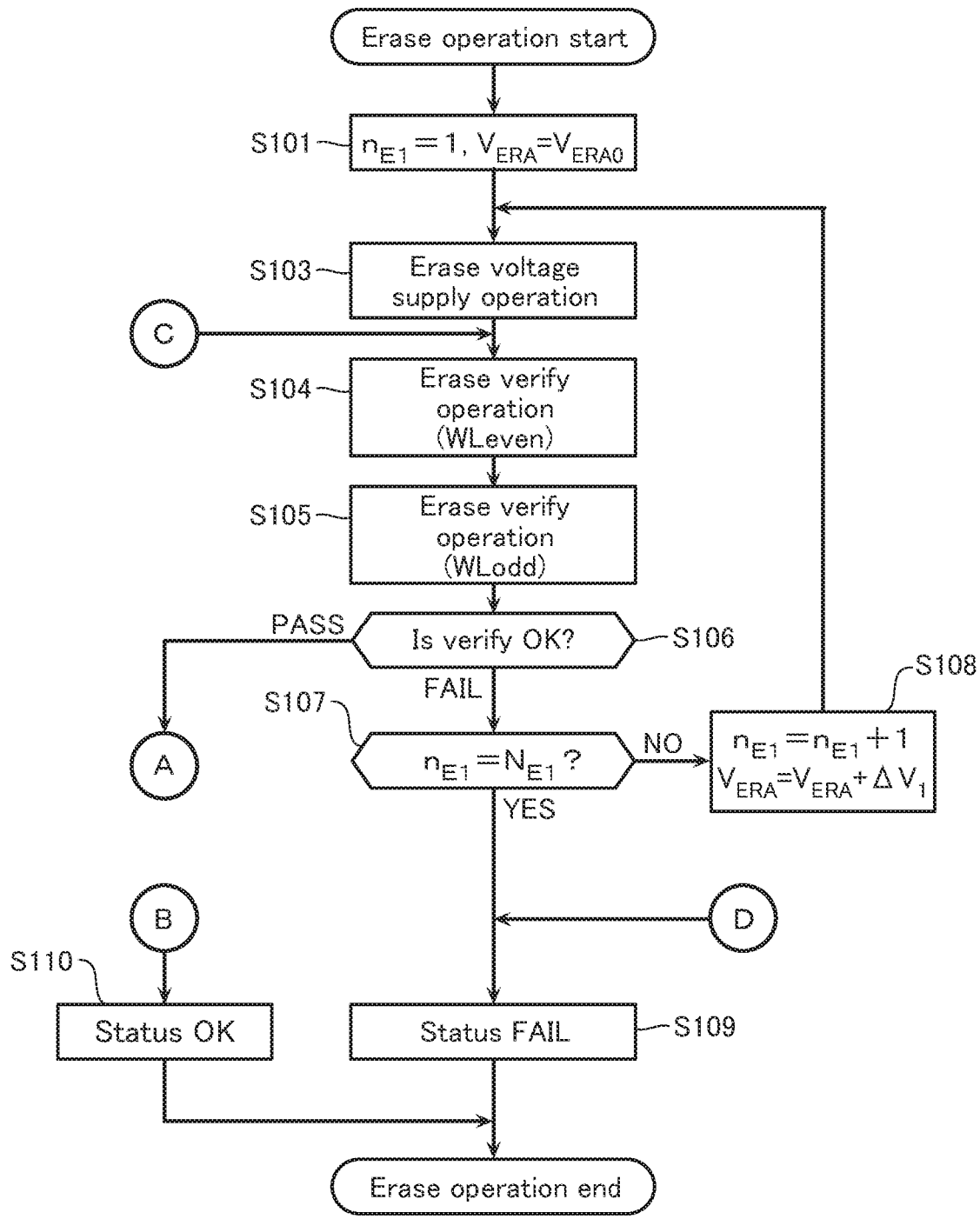
FIG. 9 is a flowchart for describing an erase operation of the memory die MD of the first embodiment.
Figure 10:
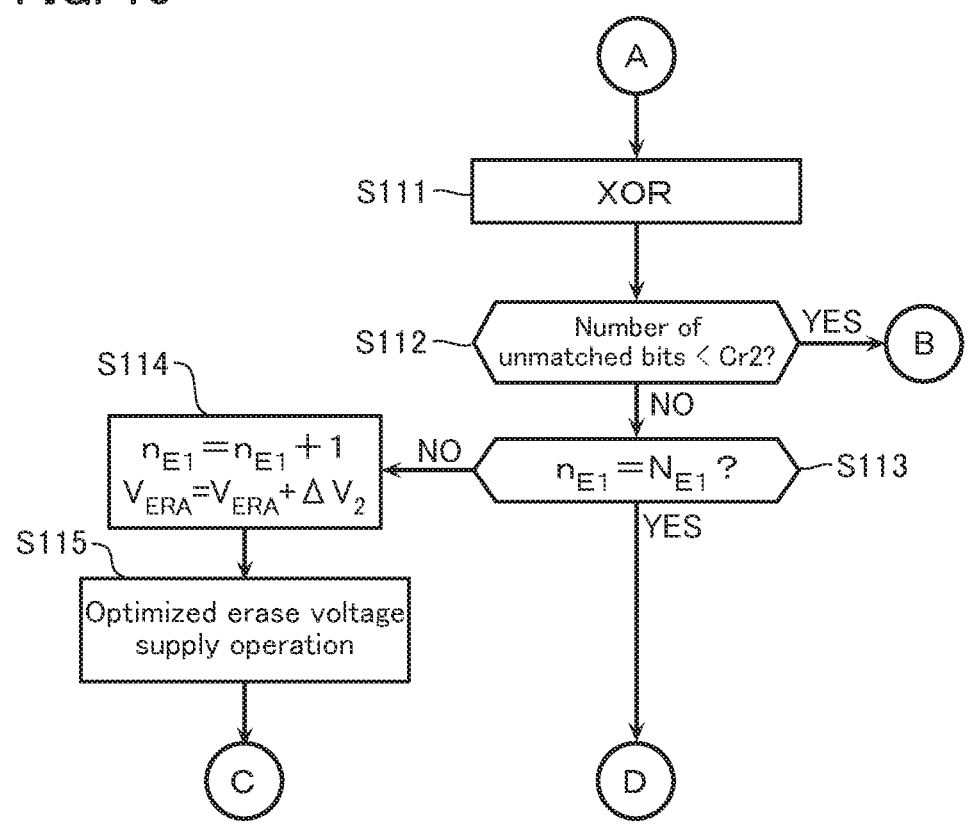
FIG. 10 is a flowchart for describing the erase operation of the memory die MD of the first embodiment.
Figure 11:
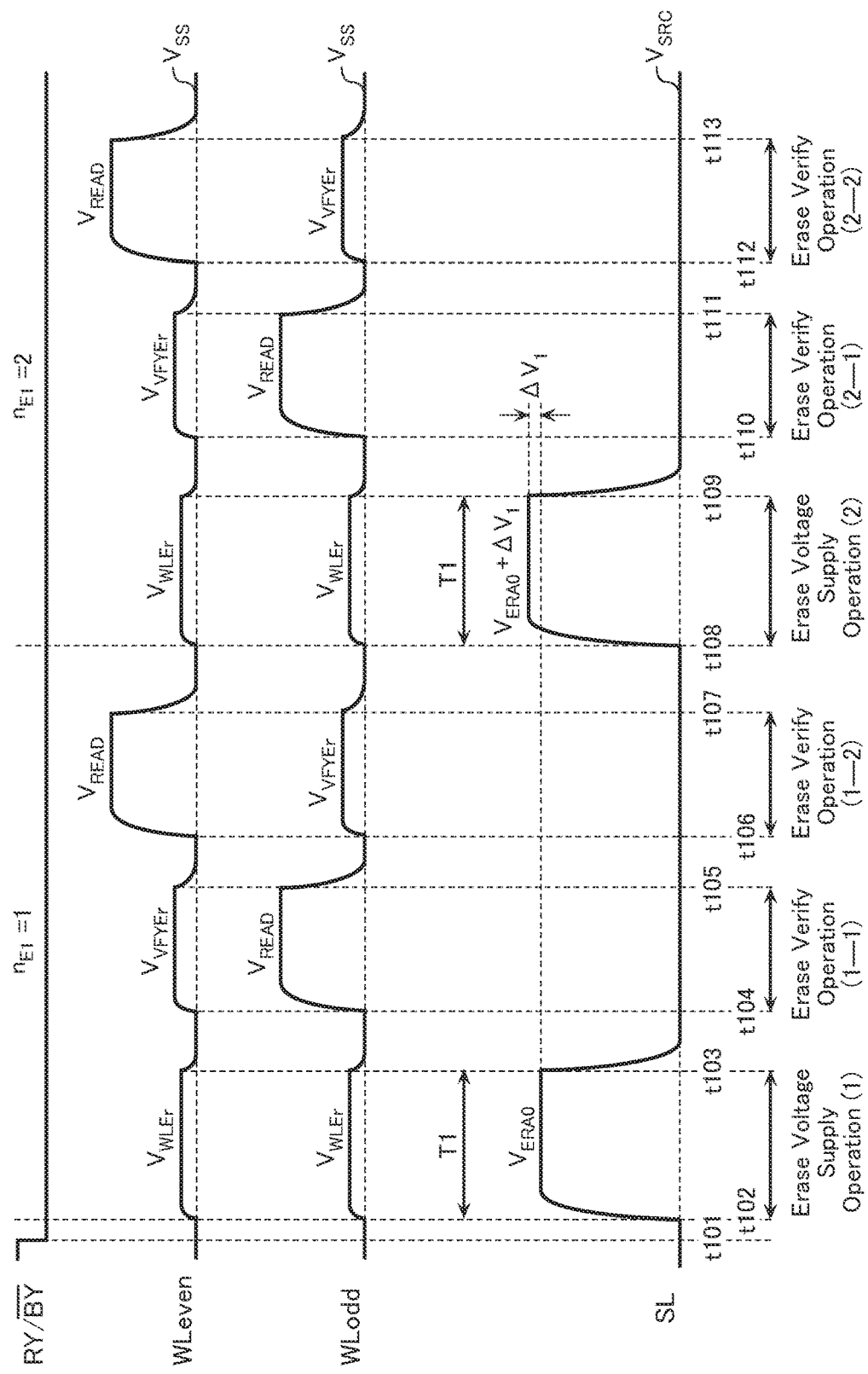
FIG. 11 is a timing chart for describing an erase voltage supply operation and an erase verify operation.
Figure 12:
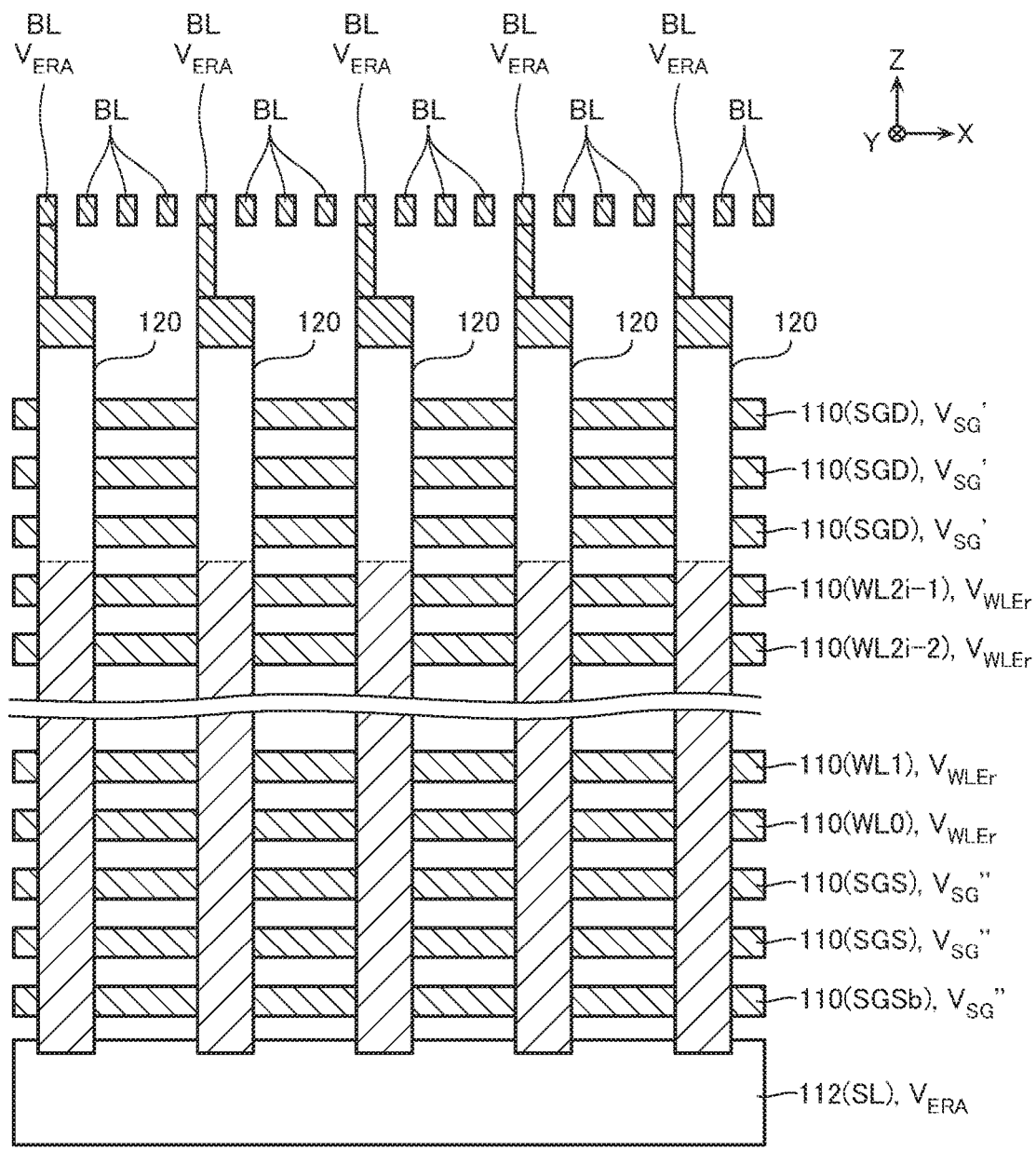
FIG. 12 is a schematic cross-sectional view for describing the erase voltage supply operation.
Figure 13:
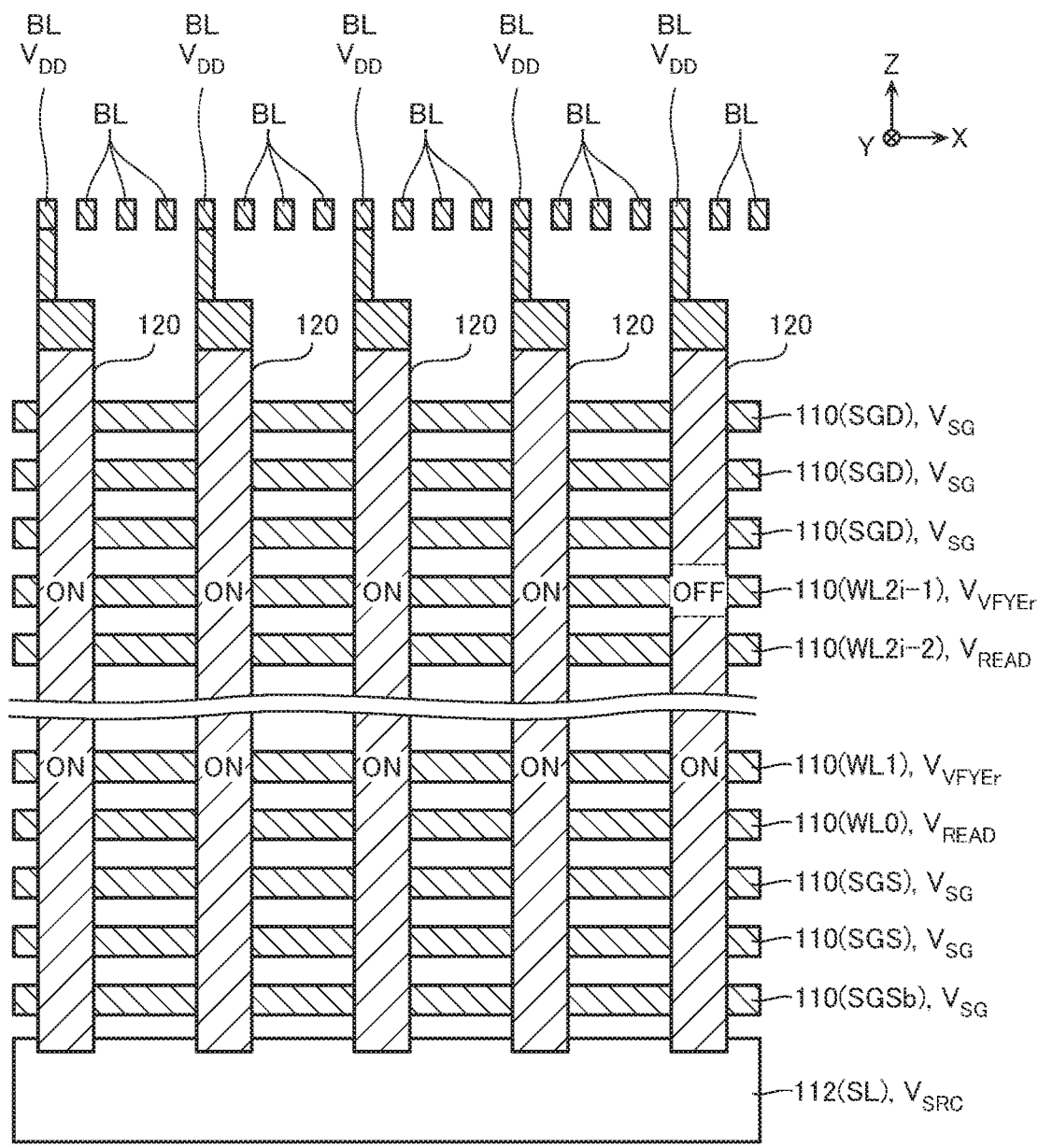
FIG. 13 is a schematic cross-sectional view for describing the erase verify operation.
Figure 14:
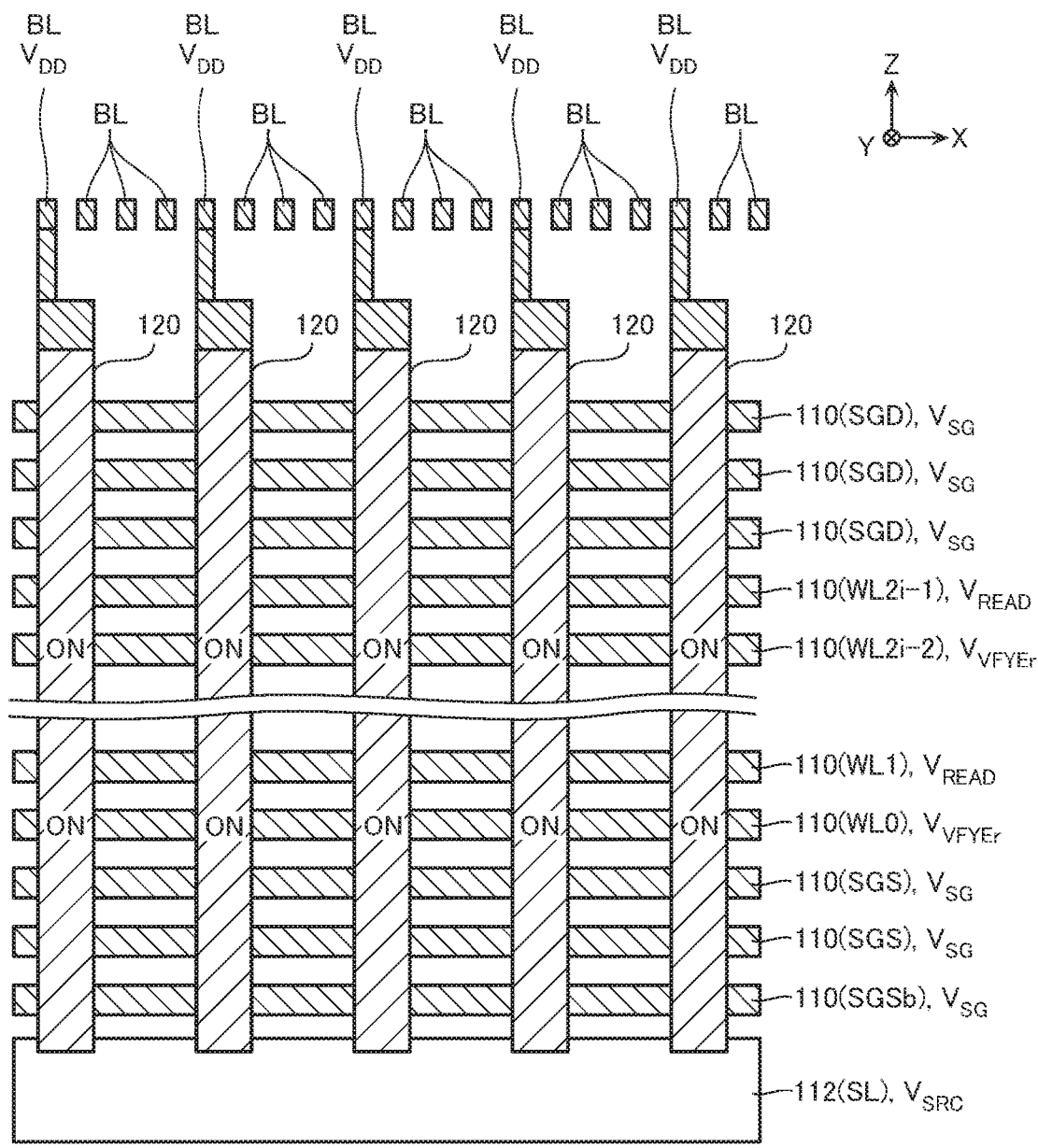
FIG. 14 is a schematic cross-sectional view for describing the erase verify operation.
Figure 16:
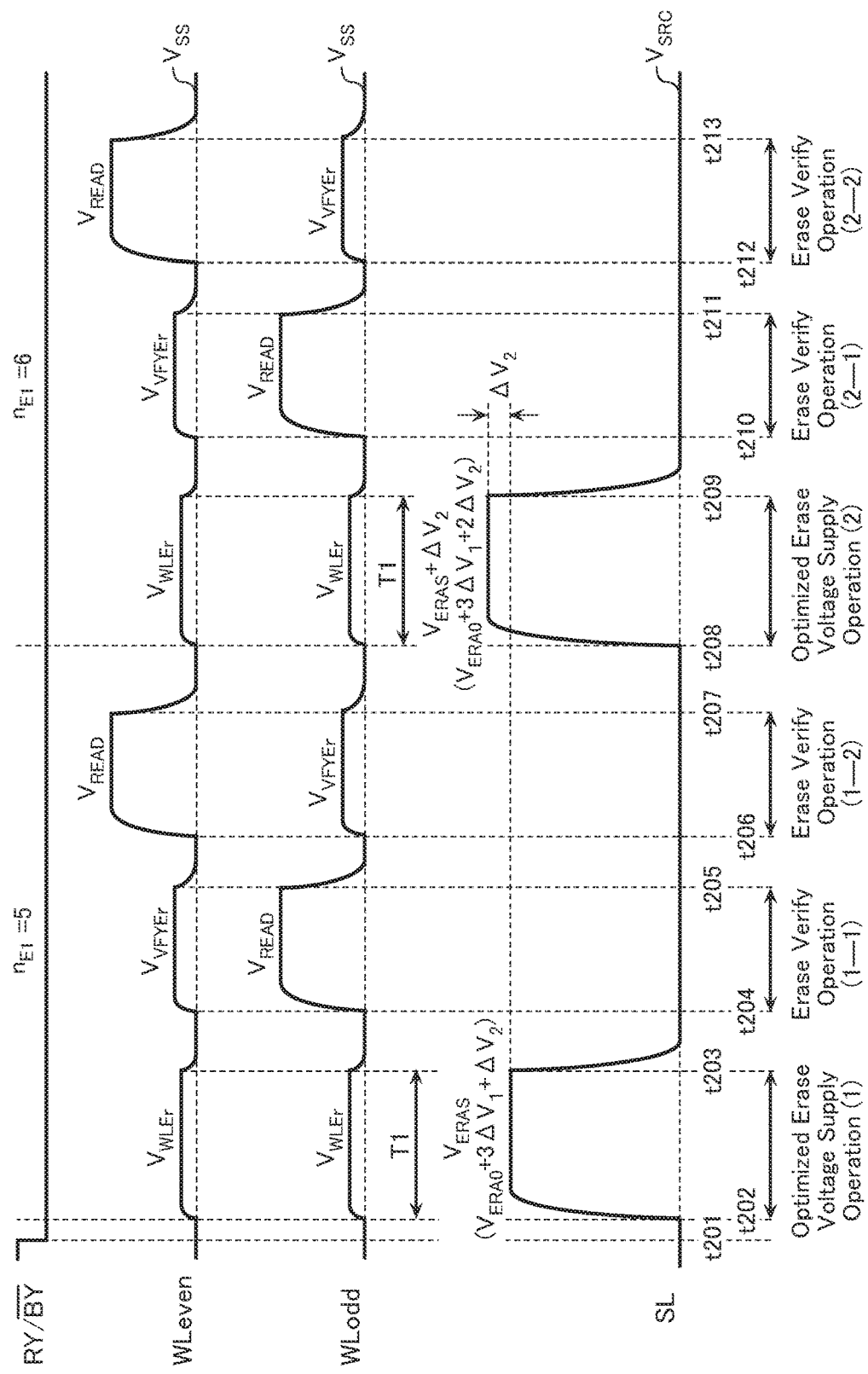
FIG. 16 is a timing chart for describing an optimized erase voltage supply operation and an erase verify operation of the first embodiment.
Figure 17:
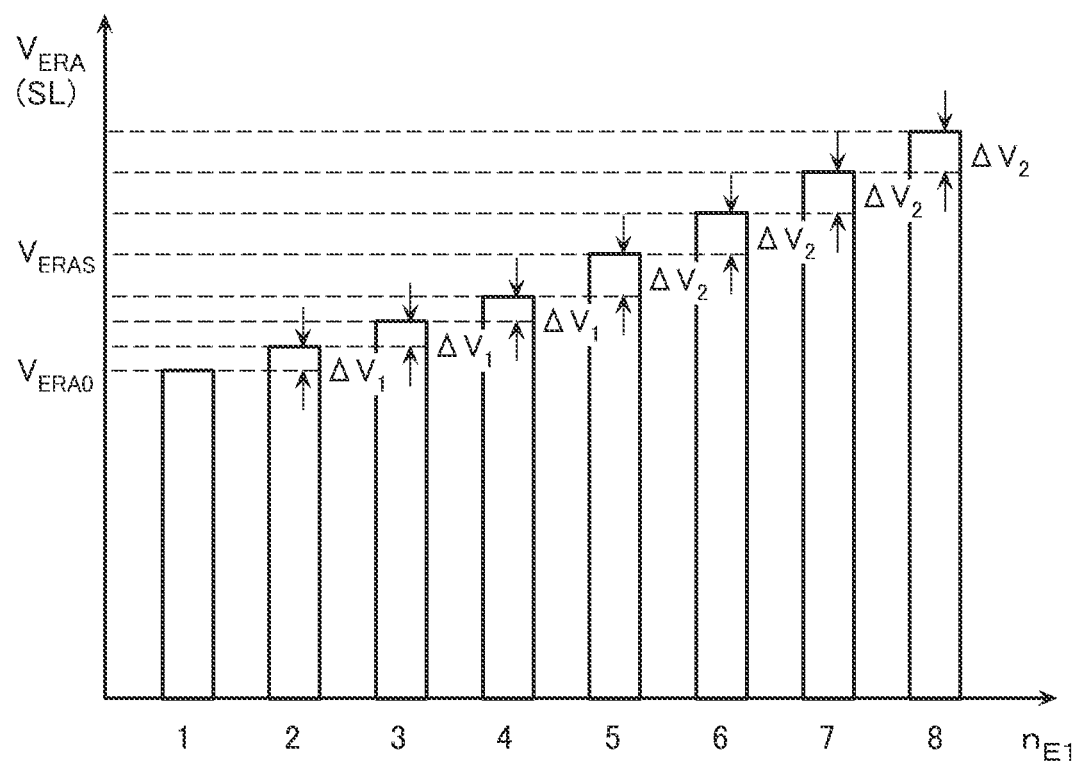
FIG. 17 is a drawing for describing a relation between a loop count $n_{E1}$ and an erase voltage $V_{ERA}$ in the first embodiment.

FIG. 9 and FIG. 10 are flowcharts for describing the erase operation of the memory die MD of the first embodiment. FIG. 11 is a timing chart for describing an erase voltage supply operation and an erase verify operation. FIG. 12 is a schematic cross-sectional view for describing the erase voltage supply operation. FIG. 13 is a schematic cross-sectional view for describing the erase verify operation to the even-numbered word line WLeven. FIG. 14 is a schematic cross-sectional view for describing the erase verify operation to the odd-numbered word line WLodd. FIG. 15 is a drawing for describing a logical operation XOR. FIG. 16 is a timing chart for describing an optimized erase voltage supply operation and an erase verify operation of the first embodiment. FIG. 17 is a drawing for describing a relation between a loop count $n_{E1}$ and an erase voltage $V_{ERA}$ in the first embodiment.

In the following description, an example of performing the erase operation on the memory block BLK as a target for operation will be described.

The erase operation includes a plurality of erase loops. Each of the erase loops includes an operation to decrease the threshold voltage of the memory cell MC (Steps S103, S115, and the like described later) and an operation to confirm the threshold voltage of the memory cell MC (Steps S104, S105, and the like described later). In the erase operation, for example, in the first to a-th erase loops (where a is an integer of 2 or more), Steps S103 to S108 in FIG. 9 may be executed, and in the a+1-th to b-th erase loops (where b is an integer of a+2 or more), Steps S111 to S115 of FIG. 10 and Steps S104 to S106 of FIG. 9 may be executed. The same applies to the erase loops in the erase operations of a second embodiment to a fifth embodiment.

In Step S101, for example, as illustrated in FIG. 9, the loop count $n_{E1}$ is set to 1. The loop count $n_{E1}$ is a variable indicating the number of the erase loops. The erase voltage $V_{ERA}$ is set to an initial erase voltage $V_{ERA0}$. This operation is executed, for example, at timing t101 of FIG. 11. A RY/(/BY) signal becomes L, and an access to the chip may be inhibited.

In Step S103, an erase voltage supply operation is executed. The erase voltage supply operation is an operation to decrease the threshold voltage of the memory cell MC by applying a voltage $V_{WLEr}$ to the word lines WL0 to WL2$i$−1 (odd-numbered word lines WLodd and even-numbered word lines WLeven) and applying the erase voltage $V_{ERA}$ to the bit lines BL and the source line SL. For example, in the example of FIG. 11, this operation is executed in a period from timing t102 to timing t103 (execution period of erase voltage supply operation (1) of FIG. 11) and a period from timing t108 to timing t109 (execution period of erase voltage supply operation (2) of FIG. 11).

In the erase voltage supply operation, for example, as illustrated in FIG. 11 and FIG. 12, the erase voltage $V_{ERA}$ (here, initial erase voltage $V_{ERA0}$) is applied to the bit lines BL and the source line SL. For example, the erase voltage $V_{ERA}$ is a voltage of about 17 V to 25 V.

In the erase voltage supply operation, for example, as illustrated in FIG. 12, a voltage $V_{SG}'$ is applied to the drain-side select gate lines SGD. The voltage $V_{SG}'$ is smaller than the erase voltage $V_{ERA}$. Thus, a Gate Induced Drain Leakage (GIDL) occurs in the drain-side select transistor STD, and electron and hole pairs are generated. The electrons move to a bit line BL side, and the holes move to a memory cell MC side.

In the erase voltage supply operation, for example, as illustrated in FIG. 12, a voltage $V_{SG}''$ is applied to the source-side select gate lines SGS, SGSb. The voltage $V_{SG}''$ is smaller than the erase voltage $V_{ERA}$. Thus, the GIDL occurs in the source-side select transistors STS, STSb, and the electron and hole pairs are generated. The electrons move to a source line SL side, and the holes move to the memory cell MC side.

In the erase voltage supply operation, for example, as illustrated in FIG. 11 and FIG. 12, the voltage $V_{WLEr}$ is applied to the word lines WL0 to WL2$i$−1 (odd-numbered word lines WLodd and even-numbered word lines WLeven). This voltage $V_{WLEr}$ is a voltage of, for example, about 0.5 V. The voltage $V_{WLEr}$ may be a ground voltage $V_{SS}$ (0 V), and may be a voltage smaller than the ground voltage $V_{SS}$ (0 V). Thus, the holes in the channel of the semiconductor column 120 tunnel to the electric charge accumulating film 132

(FIG. 7) via the tunnel insulating film 131 (FIG. 7). Accordingly, the threshold voltage of the memory cell MC decreases.

In Step S104 (FIG. 9), the erase verify operation to the even-numbered word line WLeven (hereinafter referred to as an even number erase verify operation) is performed. This even number erase verify operation is an operation to detect whether the threshold voltage of the even-numbered memory cell MC has reached a target value or not by detecting an ON state/OFF state of the even-numbered memory cell MC. For example, in the example of FIG. 11, this operation is executed in a period from timing t104 to timing t105 (execution period of erase verify operation (1-1) of FIG. 11) and a period from timing t110 to timing t11 (execution period of erase verify operation (2-1) of FIG. 11).

In the even number erase verify operation, for example, as illustrated in FIG. 13, a voltage $V_{DD}$ is applied to the bit lines BL. A voltage $V_{SRC}$ is applied to the source line SL. The voltage $V_{SRC}$ may be larger than the ground voltage $V_{SS}$, and may be equal to the ground voltage $V_{SS}$. The voltage $V_{DD}$ is larger than the voltage $V_{SRC}$.

In the even number erase verify operation, for example, as illustrated in FIG. 13, a voltage $V_{SG}$ is applied to the drain-side select gate lines SGD. The voltage $V_{SG}$ is larger than the voltage $V_{DD}$. A voltage difference between the voltage $V_{SG}$ and the voltage $V_{DD}$ is larger than the threshold voltage of the drain-side select transistor STD. Therefore, an electron channel is formed in a channel region of the drain-side select transistor STD, and the voltage $V_{DD}$ is transferred.

In the even number erase verify operation, for example, as illustrated in FIG. 13, the voltage $V_{SG}$ is applied to the source-side select gate lines SGS, SGSb. The voltage $V_{SG}$ is larger than the voltage $V_{SRC}$. A voltage difference between the voltage $V_{SG}$ and the voltage $V_{SRC}$ is larger than the threshold voltages of the source-side select transistors STS, STSb. Therefore, electron channels are formed in channel regions of the source-side select transistors STS, STSb, and the voltage $V_{SRC}$ is transferred.

In the even number erase verify operation, for example, as illustrated in FIG. 13, a read pass voltage $V_{READ}$ is applied to the odd-numbered word lines WLodd. The read pass voltage $V_{READ}$ is larger than the voltages $V_{DD}$, $V_{SRC}$. The read pass voltage $V_{READ}$ is a voltage of, for example, about 6 V. Voltage differences between the read pass voltage $V_{READ}$ and the voltages $V_{DD}$, $V_{SRC}$ are larger than the threshold voltage of the memory cell MC regardless of the data stored in the memory cell MC. Accordingly, electron channels are formed in the channel regions of the odd-numbered memory cells MC0, MC2, ..., MC2i−2, and the voltages $V_{DD}$, $V_{SRC}$ are transferred to the even-numbered memory cells MC1, MC3, ..., MC2i−1.

In the even number erase verify operation, for example, as illustrated in FIG. 13, the erase verify voltage $V_{VFYEr}$ is applied to the even-numbered selected word lines WLeven. The erase verify voltage $V_{VFYEr}$ is smaller than the read pass voltage $V_{READ}$ (FIG. 8A). The erase verify voltage $V_{VFYEr}$ is a voltage of, for example, about 1.0 V. Thus, as illustrated in FIG. 13, the memory cells MC having the threshold voltages equal to or less than the erase verify voltage $V_{VFYEr}$ become the ON state, and the memory cells MC having the threshold voltages larger than the erase verify voltage $V_{VFYEr}$ become the OFF state. The ON states/OFF states of these memory cells MC are detected by the sense amplifier module SAM (FIG. 5) via the bit lines BL, thus obtaining the data indicating the states of these memory cells MC. This operation is referred to as a "sense operation".

In the sense operation, for example, in a state of applying the voltage $V_{DD}$ to the bit line BL, a sense node of the sense amplifier SA (FIG. 5) is electrically conducted with the bit line BL for a certain period. After executing the sense operation, the electric charge of the wiring LBUS is discharged or maintained corresponding to the state of the sense node. Any of the latch circuits in the sense amplifier unit SAU is electrically conducted with the wiring LBUS, and the data of the wiring LBUS is latched by this latch circuit.

The data indicating the ON state/OFF state of the memory cell MC is transferred to the latch circuits XDL0 to XDLm−1 (FIG. 5) of the cache memory CM via the wiring LBUS, the switch transistor DSW, and the wiring DBUS (FIG. 5).

The plurality of latch circuits XDL0 to XDLm−1 of the cache memory CM store the data indicating the ON state/OFF state of the memory cells MC (here, even-numbered memory cells MC1, MC3, ..., MC2i−1) corresponding to the plurality of bit lines BL0 to BLm−1, respectively.

For example, when all of the even-numbered memory cells MC1, MC3, ..., MC2i−1 corresponding to one bit line BL are in the ON state, data "1" is stored in the latch circuit XDL corresponding to the bit line BL. The data "1" indicates that the data of all of the even-numbered memory cells MC1, MC3, ..., MC2i−1 corresponding to one bit line BL is erased (that is, the threshold voltages of all of the even-numbered memory cells MC1, MC3, ..., MC2i−1 are equal to or less than the erase verify voltage $V_{VFYEr}$).

For example, when at least one of the even-numbered memory cells MC1, MC3, ..., MC2i−1 corresponding to one bit line BL is in the OFF state, data "0" is stored in the latch circuit XDL corresponding to the bit line BL. The data "0" indicates that the data of at least one of the even-numbered memory cells MC1, MC3, ..., MC2i−1 corresponding to the bit line BL has not been erased (that is, the threshold voltage of at least one of the even-numbered memory cells MC1, MC3, ..., MC2i−1 is larger than the erase verify voltage $V_{VFYEr}$).

For example, the bit lines BL connected to the five semiconductor columns 120 illustrated in FIG. 13 are defined as the bit lines BL0, BL1, BL2, BL3, BL4 from a −X-side to a +X-side. In this case, the data stored in the latch circuits XDL0 to XDL4 are "1", "1", "1", "1", and "0", respectively. Hereinafter, the bit of the data "1" is referred to as a bit of erase pass in some cases. The bit of the data "0" is referred to as a bit of erase fail in some cases.

In Step S105 (FIG. 9), the erase verify operation to the odd-numbered word line WLodd (hereinafter referred to as an odd number erase verify operation) is performed. This odd number erase verify operation is an operation to detect whether the threshold voltage of the odd-numbered memory cell MC has reached a target value or not by detecting an ON state/OFF state of the odd-numbered memory cell MC. For example, in the example of FIG. 11, this operation is executed in a period from timing t106 to timing t107 (execution period of erase verify operation (1-2) of FIG. 11) and a period from timing t112 to timing t113 (execution period of erase verify operation (2-2) of FIG. 11).

The odd number erase verify operation is basically similar to the even number erase verify operation. However, as described above, in the even number erase verify operation, the read pass voltage $V_{READ}$ is applied to the odd-numbered word lines WLodd, and the erase verify voltage $V_{VFYEr}$ is applied to the even-numbered word lines WLeven (FIG. 13). Meanwhile, in the odd number erase verify operation, for example, as illustrated in FIG. 11 and FIG. 14, the read pass voltage $V_{READ}$ is applied to the even-numbered word lines WLeven, and the erase verify voltage $V_{VFYEr}$ is applied to the odd-numbered word lines WLodd.

For example, the bit lines BL connected to the five semiconductor columns 120 illustrated in FIG. 14 are defined as the bit lines BL0, BL1, BL2, BL3, BL4 from the −X-side to the +X-side. In this case, the data stored in the latch circuits XDL0 to XDL4 are "1", "1", "1", "1", and "1", respectively.

In Step S106 (FIG. 9), a result of the erase verify operation is determined. For example, the data obtained by the even number erase verify operation in Step S104 (hereinafter referred to as even number word line data) is sequentially transferred from the latch circuits XDL0 to XDLm−1 to the counter CNT (FIG. 2). The counter CNT counts the number of bits of erase fail (the number of bits of the data "0") in the even number word line data. Counting the number of bits of erase fail is performed at the end of Step S104. The number of bits of erase fail is transferred to the sequencer SQC. The sequencer SQC determines whether the number of bits of erase fail of the even number word line data is less than a first reference value Cr1 or not.

The data obtained by the odd number erase verify operation in Step S105 (hereinafter referred to as odd number word line data) is sequentially transferred from the latch circuits XDL0 to XDLm−1 to the counter CNT (FIG. 2). The counter CNT counts the number of bits of erase fail (the number of bits of the data "0") in the odd number word line data. Counting the number of bits of erase fail is performed at the end of Step S105. The number of bits of erase fail is transferred to the sequencer SQC. The sequencer SQC determines whether the number of bits of erase fail of the odd number word line data is less than the first reference value Cr1 or not.

When the number of bits of erase fail of the even number word line data is less than the first reference value Cr1, and the number of bits of erase fail of the odd number word line data is less than the first reference value Cr1, the sequencer SQC determines it as verify PASS, and the process proceeds to Step S111. Meanwhile, when the number of bits of erase fail of the even number word line data is equal to or more than the first reference value Cr1, or the number of bits of erase fail of the odd number word line data is equal to or more than the first reference value Cr1, the sequencer SQC determines it as verify FAIL, and the process proceeds to Step S107.

In Step S107, whether the loop count $n_{E1}$ has reached a predetermined count $N_{E1}$ or not is determined. When the loop count $n_{E1}$ has not reached the predetermined count $N_{E1}$, the process proceeds to Step S108. When the loop count $n_{E1}$ has reached the predetermined count $N_{E1}$, the process proceeds to Step S109.

In Step S108, 1 is added to the loop count $n_{E1}$. In Step S108, an offset voltage $\Delta V_1$ is added to the erase voltage $V_{ERA}$. Therefore, the erase voltage $V_{ERA}$ increases by the offset voltage $\Delta V_1$ in each erase loop in accordance with the increase in the loop count $n_{E1}$. Then, the process proceeds to Step S103.

In Step S111, an exclusive OR (XOR) of the even number word line data and the odd number word line data is calculated. The exclusive OR (XOR) can be calculated, for example, using the sense amplifier module SAM.

For example, as illustrated in FIG. 15, the even number word line data and the odd number word line data is assumed to be 16-bit data. In this case, the exclusive OR of the even number word line data "1111 0111 1111 1110" corresponding to the bit lines BL0 to BL15 and the odd number word line data "1111 1111 1111 1110" corresponding to the bit lines BL0 to BL15 is calculated. In this example, result data of the exclusive OR is "0000 1000 0000 0000".

The result data of the exclusive OR corresponding to the bit lines BL0 to BLm−1 are transferred to the latch circuits XDL0 to XDLm−1, respectively.

In Step S112 (FIG. 10), whether the number of unmatched bits between the even number word line data and the odd number word line data is less than a second reference value Cr2 or not is determined. The unmatched bit between the even number word line data and the odd number word line data is a bit of the data "1" in the result data of the exclusive OR (XOR) of the even number word line data and the odd number word line data. The counter CNT counts the number of unmatched bits (the number of bits of the data "1") in the result data. The number of unmatched bits is transferred to the sequencer SQC. The sequencer SQC determines whether the number of unmatched bits is less than the second reference value Cr2 or not.

When the number of unmatched bits is less than the second reference value Cr2, the sequencer SQC determines it as verify PASS, and the process proceeds to Step S110 (FIG. 9). Meanwhile, when the number of unmatched bits is equal to or more than the second reference value Cr2, the sequencer SQC determines it as verify FAIL, and the process proceeds to Step S113 (FIG. 10).

In Step S113 (FIG. 10), whether the loop count $n_{E1}$ has reached the predetermined count NE' or not is determined. When the loop count $n_{E1}$ has not reached the predetermined count $N_{E1}$, the process proceeds to Step S114. When the loop count $n_{E1}$ has reached the predetermined count $N_{E1}$, the process proceeds to Step S109 (FIG. 9).

In Step S114 (FIG. 10), 1 is added to the loop count $n_{E1}$. In Step S114, an offset voltage $\Delta V_2$ is added to the erase voltage $V_{ERA}$. Therefore, the erase voltage $V_{ERA}$ increases by the offset voltage $\Delta V_2$ in each erase loop in accordance with the increase in the loop count $n_{E1}$.

In Step S115 (FIG. 10), an optimized erase voltage supply operation is executed. Similarly to the erase voltage supply operation in Step S103, the optimized erase voltage supply operation is an operation to decrease the threshold voltage of the memory cell MC by applying the voltage $V_{WLEr}$ to the word lines WL0 to WL2i−1 (odd-numbered word lines WLodd and even-numbered word lines WLeven) and applying the erase voltage $V_{ERA}$ to the bit lines BL and the source line SL.

However, in the erase voltage supply operation, as illustrated in FIG. 11 and FIG. 17, the erase voltage $V_{ERA}$ increases by the offset voltage $\Delta V_1$ every time when 1 is added to the loop count $n_{E1}$ (Steps S103, S108). Meanwhile, in the optimized erase voltage supply operation, as illustrated in FIG. 16 and FIG. 17, the erase voltage $V_{ERA}$ increases by the offset voltage $\Delta V_2$ every time when 1 is added to the loop count $n_{E1}$ (Steps S114, S115).

For example, in the example of FIG. 17, when the loop count $n_{E1}$ is 1, the initial erase voltage $V_{ERA0}$ is applied to the bit lines BL and the source line SL in the erase voltage supply operation. Then, the erase voltage $V_{ERA}$ increases by the offset voltage $\Delta V_1$ every time when 1 is added to the loop count $n_{E1}$. The erase voltage supply operation is executed until a time point at which the loop count $n_{E1}$ is 4. When the loop count $n_{E1}$ is 5, the optimized erase voltage supply operation is executed. At this time, the erase voltage $V_{ERA}$ is a voltage in which the offset voltage $\Delta V_2$ is added to the erase voltage $V_{ERA}$ when the loop count $n_{E1}$ is 4 (=$V_{ERA0}$+$3\Delta V_1$). The erase voltage $V_{ERA}$ at this time is defined as an erase voltage $V_{ERAS}$ (=$V_{ERA0}$+$3\Delta V_1$+$\Delta V_2$). Then, every time when 1 is added to the loop count $n_{E1}$, the erase voltage $V_{ERA}$ increases by the offset voltage $\Delta V_2$.

The offset voltage $\Delta V_2$ is larger than the offset voltage $\Delta V_1$. For example, the offset voltage $\Delta V_2$ may be a voltage approximately double to three times of the offset voltage $\Delta V_1$. Accordingly, the optimized erase voltage supply operation easily decreases the threshold voltage of the memory cell MC compared with the erase voltage supply operation.

In the example of FIG. 16, the optimized erase voltage supply operation is executed in a period from timing t202 to timing t203 (execution period of optimized erase voltage supply operation (1) of FIG. 16) and a period from timing t208 to timing t209 (execution period of optimized erase voltage supply operation (2) of FIG. 16). At the timing at which the optimized erase voltage supply operation (1) is executed, the loop count $n_{E1}$ is 5, and the erase voltage $V_{ERA}$ is $V_{ERAS}$ ($=V_{ERA0}+3\Delta V_1+\Delta V_2$). At the timing at which the optimized erase voltage supply operation (2) is executed, the loop count $n_{E1}$ is 6, and the erase voltage $V_{ERA}$ is $V_{ERAS}+\Delta V_2$ ($=V_{ERA0}+3\Delta V_1+2\Delta V_2$). The erase verify operations (1-1), (1-2), (2-1), and (2-2) of FIG. 16 are similar to the erase verify operations (1-1), (1-2), (2-1), and (2-2) of FIG. 11.

After the optimized erase voltage supply operation of Step S115 is executed, the even number erase verify operation of Step S104 and the odd number erase verify operation of Step S105 are executed.

In Step S109 (FIG. 9), the status data $D_{ST}$ indicating the fact that the erase operation has not been normally ended is stored in the status register STR (FIG. 2), and the erase operation is ended. The RY/(/BY) signal becomes H, and the access to the chip may be allowed.

In Step S110 (FIG. 9), the status data $D_{ST}$ indicating the fact that the erase operation has been normally ended is stored in the status register STR (FIG. 2), and the erase operation is ended. The RY/(/BY) signal becomes H, and the access to the chip may be allowed.

[Effects]

In association with the increase in the number of write and erase in the memory cell array MCA, a failure or the like possibly occurs in the word line WL. When the erase voltage supply operation is performed to the memory cell MC connected to such a word line WL, it is difficult to appropriately decrease the threshold voltage of the memory cell MC in some cases.

Therefore, in the erase operation of FIG. 9 and FIG. 10, whether the threshold voltage of the memory cell MC corresponding to the word line WL of the even-numbered layer has fallen below the erase verify voltage $V_{VFYEr}$ (FIG. 8A) or not is determined by the erase verify operation of Step S104. Whether the threshold voltage of the memory cell MC corresponding to the word line WL of the odd-numbered layer has fallen below the erase verify voltage $V_{VFYEr}$ (FIG. 8A) or not is determined by the erase verify operation of Step S105.

For example, the word line WL in which the failure has occurred as described above is assumed to be the even-numbered word line WL. In this case, the threshold voltage is less likely to decrease even when the erase voltage supply operation is performed to the memory cell MC connected to such a word line WL. Therefore, the number of bits of erase fail detected in the erase verify operation of Step S104 is less likely to decrease regardless of the increase in the loop count $n_{E1}$ of the erase loop. Meanwhile, the threshold voltage of the memory cell MC connected to the word line WL without the failure normally decreases. Therefore, the number of bits of erase fail detected in the erase verify operation of Step S105 normally decreases in accordance with the increase in the loop count $n_{E1}$ of the erase loop.

In this case, at a timing at which both the even number word line data and the odd number word line data become verify PASS in Step S106, contents are significantly different between the even number word line data and the odd number word line data in some cases. Therefore, by calculating the number of unmatched bits between the even number word line data and the odd number word line data, the above-described failure and the like of the word line WL can be appropriately detected.

Here, for example, when the number of unmatched bits is equal to or more than the second reference value Cr2 in Step S112 (NO in Step S112) (FIG. 10), it is considered that the memory block BLK as a target of the erase operation is immediately determined as a memory block with failure and not to be used in the following operations.

However, even when characteristics of the word line WL slightly deteriorate, by further executing the erase voltage supply operation to the memory cell MC connected to such a word line WL, the threshold voltage of the memory cell MC can be decreased in some cases. Accordingly, when the failure of the word line WL is detected in Step S112, by immediately determining the memory block BLK as the target of the operation to be a memory block BLK with failure, such a memory block BLK possibly cannot be effectively used.

Therefore, in the erase operation according to the first embodiment, the optimized erase voltage supply operation is executed in Step S115. The erase voltage $V_{ERA}$ in this optimized erase voltage supply operation increases faster than the erase voltage $V_{ERA}$ in the erase voltage supply operation as illustrated in FIG. 16 and FIG. 17. Accordingly, the optimized erase voltage supply operation easily decreases the threshold voltage of the memory cell MC compared with the erase voltage supply operation. Consequently, the number of the memory blocks BLK determined as a memory block BLK with failure is reduced, thus allowing effectively using the memory block BLK.

Second Embodiment

In the first embodiment, by setting the offset voltage $\Delta V_2$ to be larger than the offset voltage $\Delta V_1$, the optimized erase voltage supply operation easily decreases the threshold voltage of the memory cell MC compared with the erase voltage supply operation. In contrast to this, in the second embodiment, by setting an application period of the erase voltage $V_{ERA}$ in the optimized erase voltage supply operation to be longer than an application period of the erase voltage $V_{ERA}$ in the erase voltage supply operation, the optimized erase voltage supply operation easily decreases the threshold voltage of the memory cell MC compared with the erase voltage supply operation.

Figure 18:
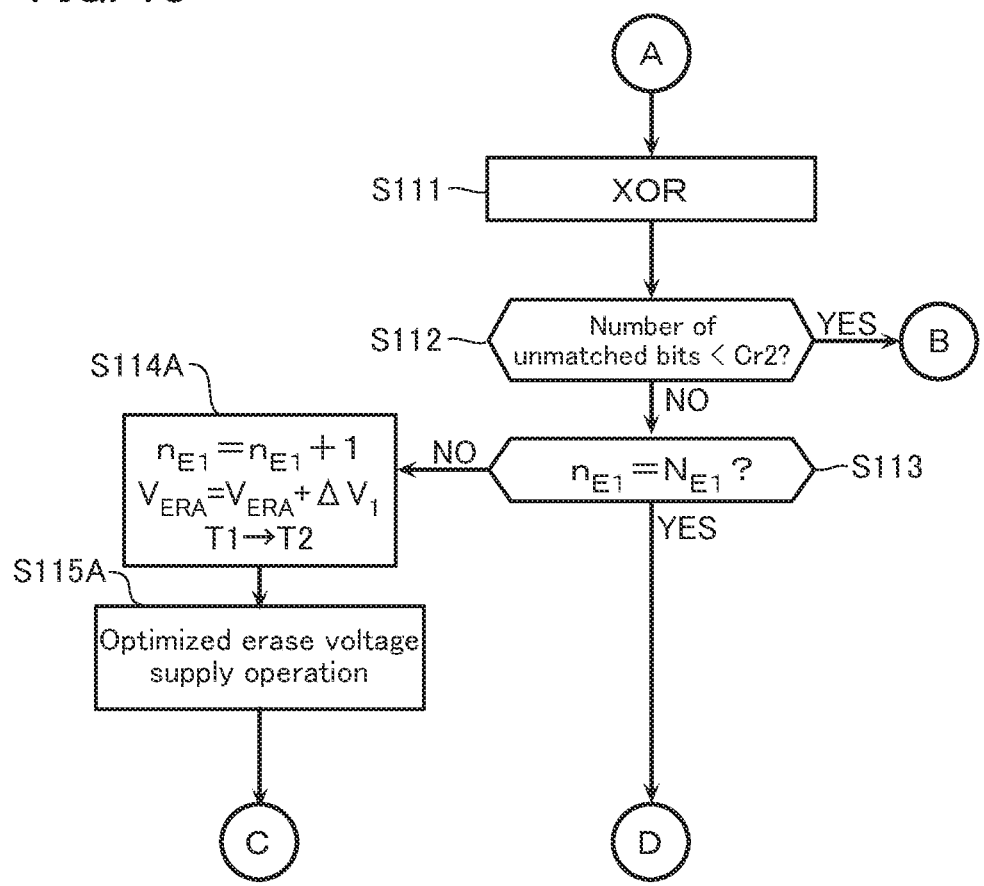
FIG. 18 is a flowchart for describing an erase operation of a memory die MD of a second embodiment.
Figure 19:
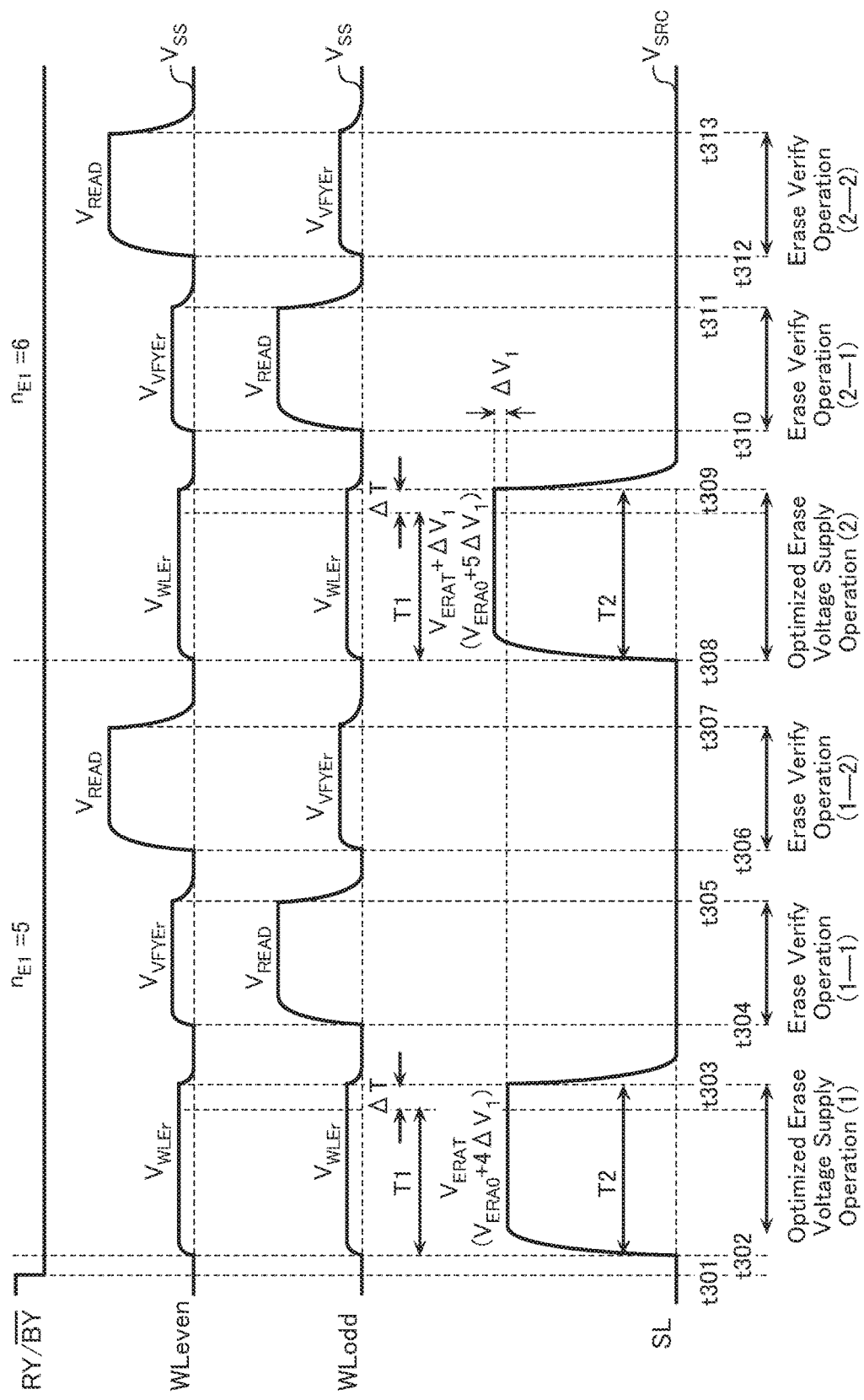
FIG. 19 is a timing chart for describing an optimized erase voltage supply operation and an erase verify operation of the second embodiment.
Figure 20:
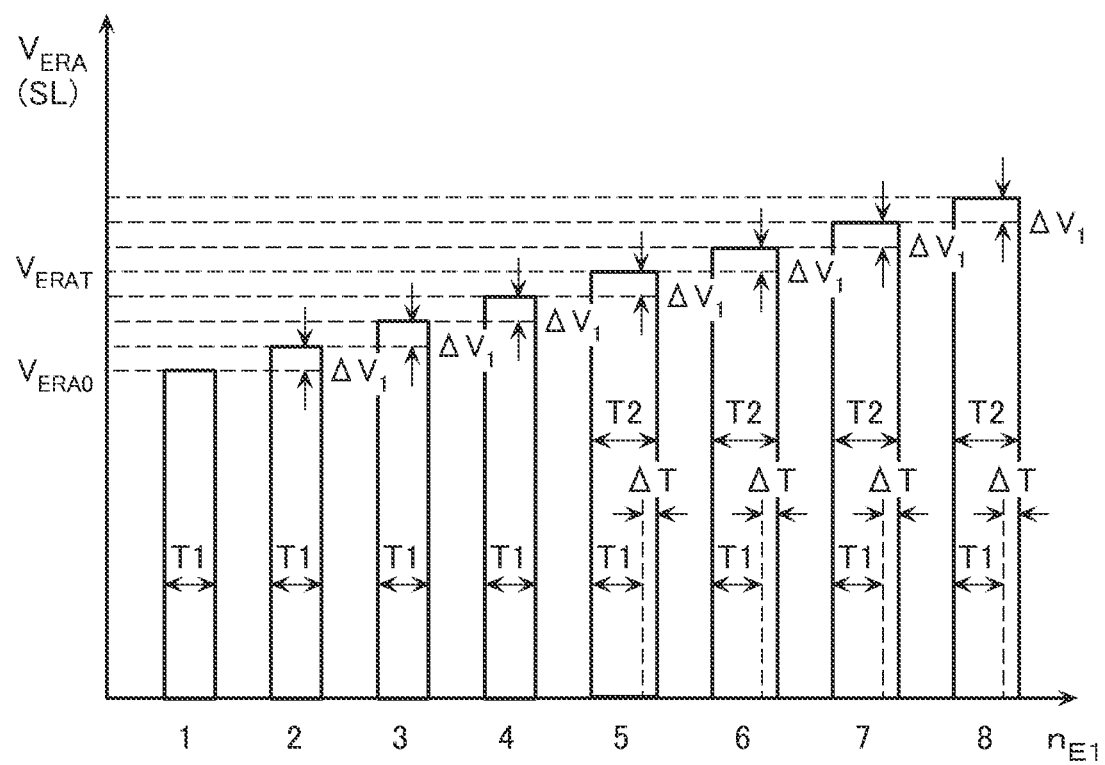
FIG. 20 is a drawing for describing a relation between a loop count $n_{E1}$ and an erase voltage $V_{ERA}$ in the second embodiment.

FIG. 18 is a flowchart for describing an erase operation of a memory die MD of the second embodiment. FIG. 19 is a timing chart for describing an optimized erase voltage supply operation and an erase verify operation of the second embodiment. FIG. 20 is a drawing for describing a relation between a loop count $n_{E1}$ and an erase voltage $V_{ERA}$ in the second embodiment.

In the erase operation of the second embodiment, Steps S101 to S110 of FIG. 9 are executed similarly to the erase operation of the first embodiment. Steps S111 to S113 of FIG. 18 are similar to Steps S111 to S113 of FIG. 10. Therefore, detailed descriptions of these processes are omitted.

In Step S113 of the erase operation according to the second embodiment, as illustrated in FIG. 18, when the loop count $n_{E1}$ has not reached the predetermined count $N_{E1}$, the process proceeds to Step S114A. In Step S114A, 1 is added to the loop count $n_{E1}$. In Step S114A, an offset voltage $\Delta V_1$ is added to the erase voltage $V_{ERA}$. In Step S114A, an application period of the erase voltage $V_{ERA}$ is changed from a time period T1 to a time period T2.

In Step S115A, an optimized erase voltage supply operation according to the second embodiment is executed. In the optimized erase voltage supply operation according to the second embodiment, similarly to the optimized erase voltage supply operation according to the first embodiment in Step S115, by applying the voltage $V_{WLEr}$ to the word lines WL0 to WL2$i$−1 (odd-numbered word lines WLodd and even-numbered word lines WLeven) and applying the erase voltage $V_{ERA}$ to the bit lines BL and the source line SL, the threshold voltage of the memory cell MC is decreased.

Here, in the erase voltage supply operation (Step S103 of FIG. 9), as illustrated in FIG. 11 and FIG. 17, the application period (pulse width) of the erase voltage $V_{ERA}$ is the time period T1. Meanwhile, in the optimized erase voltage supply operation according to the second embodiment (Step S115A of FIG. 18), as illustrated in FIG. 19 and FIG. 20, the application period (pulse width) of the erase voltage $V_{ERA}$ is the time period T2 (=T1+$\Delta$T) (Steps S114A, S115A).

For example, in the example of FIG. 20, when the loop count $n_{E1}$ is 1 to 4, the application period of the erase voltage $V_{ERA}$ is the time period T1 in the erase voltage supply operation. When the loop count $n_{E1}$ is 5 to 8, the application period of the erase voltage $V_{ERA}$ is the time period T2 (=T1+$\Delta$T) in the optimized erase voltage supply operation.

In the optimized erase voltage supply operation according to the second embodiment, as illustrated in FIG. 19 and FIG. 20, the erase voltage $V_{ERA}$ increases by the offset voltage $\Delta V_1$ every time when 1 is added to the loop count $n_{E1}$ (Steps S114A, S115A).

In the example of FIG. 19, the optimized erase voltage supply operation is executed in a period from timing t302 to timing t303 (execution period of optimized erase voltage supply operation (1) of FIG. 19) and a period from timing t308 to timing t309 (execution period of optimized erase voltage supply operation (2) of FIG. 19). At the timing at which the optimized erase voltage supply operation (1) is executed, the loop count $n_{E1}$ is 5, and the erase voltage $V_{ERA}$ is $V_{ERAT}$ (=$V_{ERA0}$+4$\Delta V_1$). At the timing at which the optimized erase voltage supply operation (2) is executed, the loop count $n_{E1}$ is 6, and the erase voltage $V_{ERA}$ is $V_{ERAT}$+$\Delta V_1$ (=$V_{ERA0}$+5$\Delta V_1$). The erase verify operations (1-1), (1-2), (2-1), and (2-2) of FIG. 19 are similar to the erase verify operations (1-1), (1-2), (2-1), and (2-2) of FIG. 11.

After the optimized erase voltage supply operation of Step S115A is executed, the even number erase verify operation of Step S104 and the odd number erase verify operation of Step S105 are executed.

Also in the second embodiment, similarly to the first embodiment, the optimized erase voltage supply operation easily decreases the threshold voltage of the memory cell MC compared with the erase voltage supply operation. Consequently, the occurrence of the memory block BLK with failure is reduced, thus allowing effectively using the memory block BLK as much as possible.

Third Embodiment

In the third embodiment, the offset voltage $\Delta V_2$ is set to be larger than the offset voltage $\Delta V_1$, and the voltage $V_{WLEr}$ applied to the odd-numbered word line WLodd or the even-numbered word line WLeven is decreased by an offset voltage $\Delta V_{WL}$, thereby easily decreasing the threshold voltage of the memory cell MC.

Figure 21:
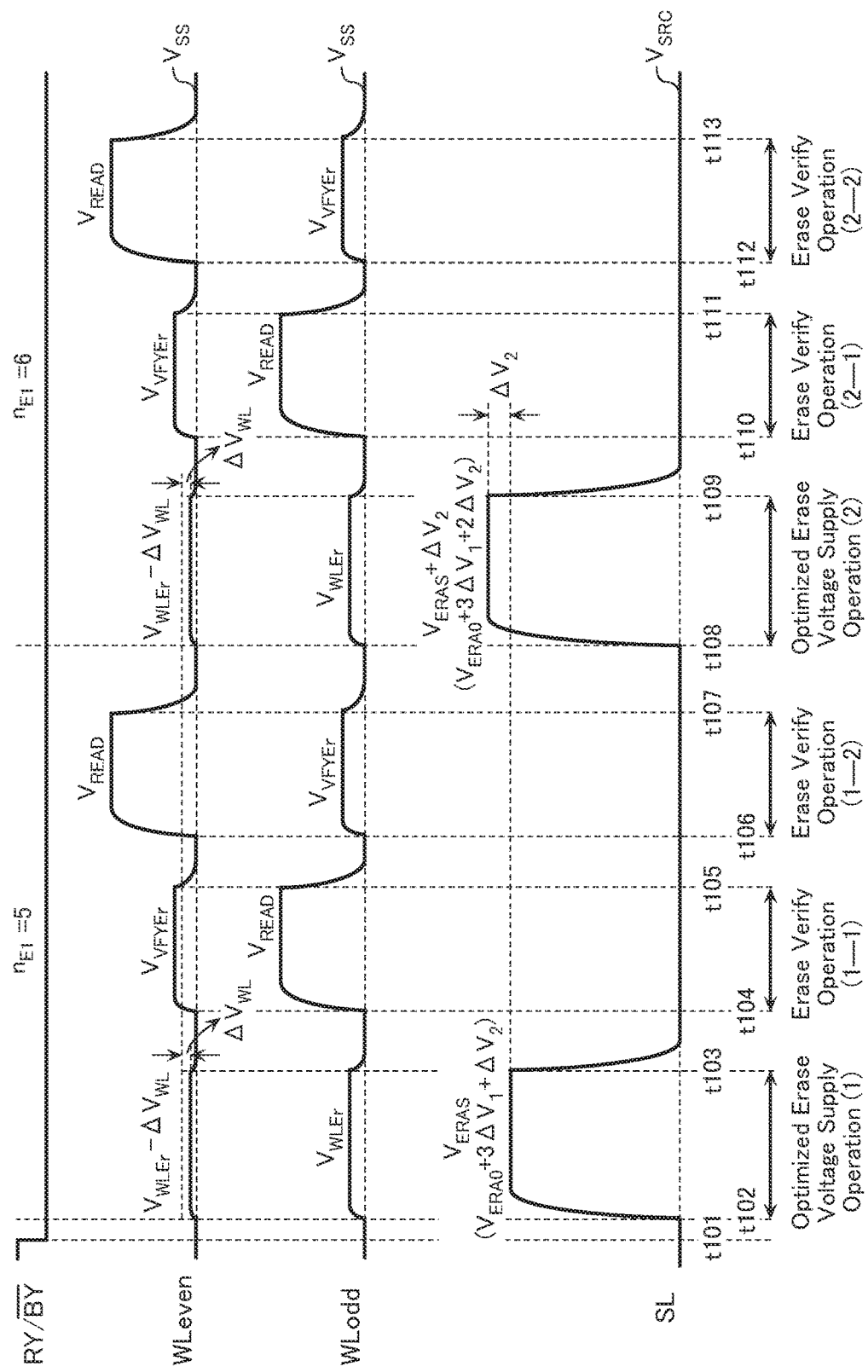
FIG. 21 is a timing chart for describing an optimized erase voltage supply operation and an erase verify operation of a third embodiment.

FIG. 21 is a timing chart for describing an optimized erase voltage supply operation and an erase verify operation of the third embodiment. The erase operation of the third embodiment is similar to Steps S101 to S115 of FIG. 9 and FIG. 10. Therefore, descriptions of the same processes as those in the first embodiment are omitted.

As described above, in Step S106 (FIG. 9), the counter CNT counts the number of bits of erase fail (the number of bits of the data "0") in the even number word line data. The number of bits of erase fail is transferred to the sequencer SQC. The sequencer SQC determines whether the number of bits of erase fail of the even number word line data is less than the first reference value Cr1 or not. The counter CNT counts the number of bits of erase fail (the number of bits of the data "0") in the odd number word line data. The number of bits of erase fail is transferred to the sequencer SQC. The sequencer SQC determines whether the number of bits of erase fail of the odd number word line data is less than the first reference value Cr1 or not.

Here, in the semiconductor memory device according to the third embodiment, the sequencer SQC determines which is larger, the number of bits of erase fail in the even number word line data or the number of bits of erase fail in the odd number word line data. When the number of bits of erase fail in the even number word line data is larger, the sequencer SQC determines to decrease the voltage $V_{WLEr}$ applied to the even-numbered word line WLeven. When the number of bits of erase fail in the odd number word line data is larger, the sequencer SQC determines to decrease the voltage $V_{WLEr}$ applied to the odd-numbered word line WLodd.

Next, the optimized erase voltage supply operation in Step S115 (FIG. 10) will be described. For example, when the voltage $V_{WLEr}$ applied to the even-numbered word line WLeven is determined to be decreased, as illustrated in FIG. 21, a voltage smaller than the voltage $V_{WLEr}$ by the offset voltage $\Delta V_{WL}$ is applied to the even-numbered word line WLeven. The voltage $V_{WLEr}$ is applied to the odd-numbered word line WLodd. For example, when the voltage $V_{WLEr}$ applied to the odd-numbered word line WLodd is determined to be decreased, a voltage smaller than the voltage $V_{WLEr}$ by the offset voltage $\Delta V_{WL}$ is applied to the odd-numbered word line WLodd. The voltage $V_{WLEr}$ is applied to the even-numbered word line WLeven. Accordingly, the optimized erase voltage supply operation according to the third embodiment can be more easily decreases the threshold voltage of the memory cell MC. Consequently, the occurrence of the memory block BLK with failure is reduced, thus allowing effectively using the memory block BLK as much as possible.

Fourth Embodiment

Figure 22:
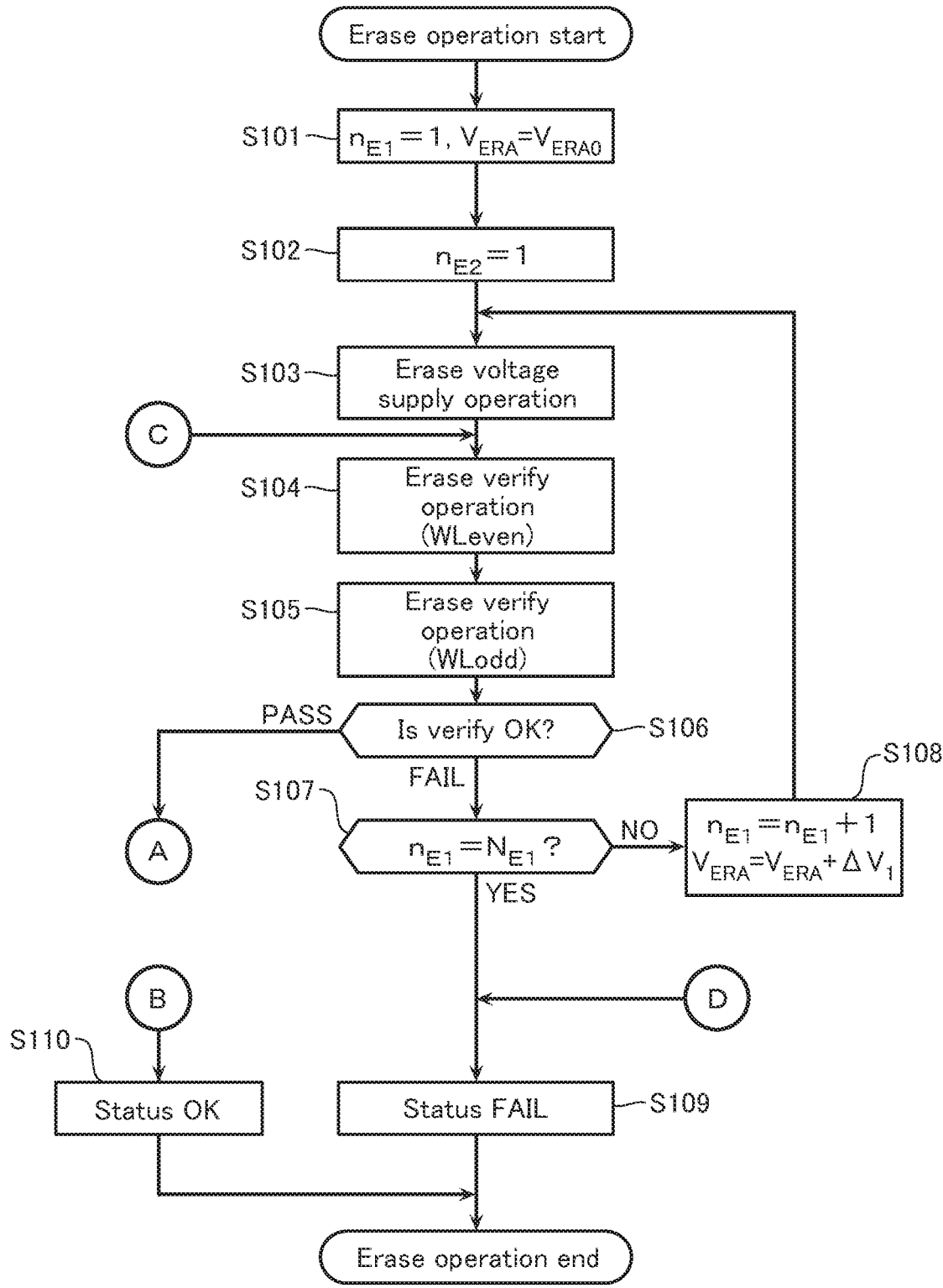
FIG. 22 is a flowchart for describing an erase operation of a memory die MD in a fourth embodiment.
Figure 23:
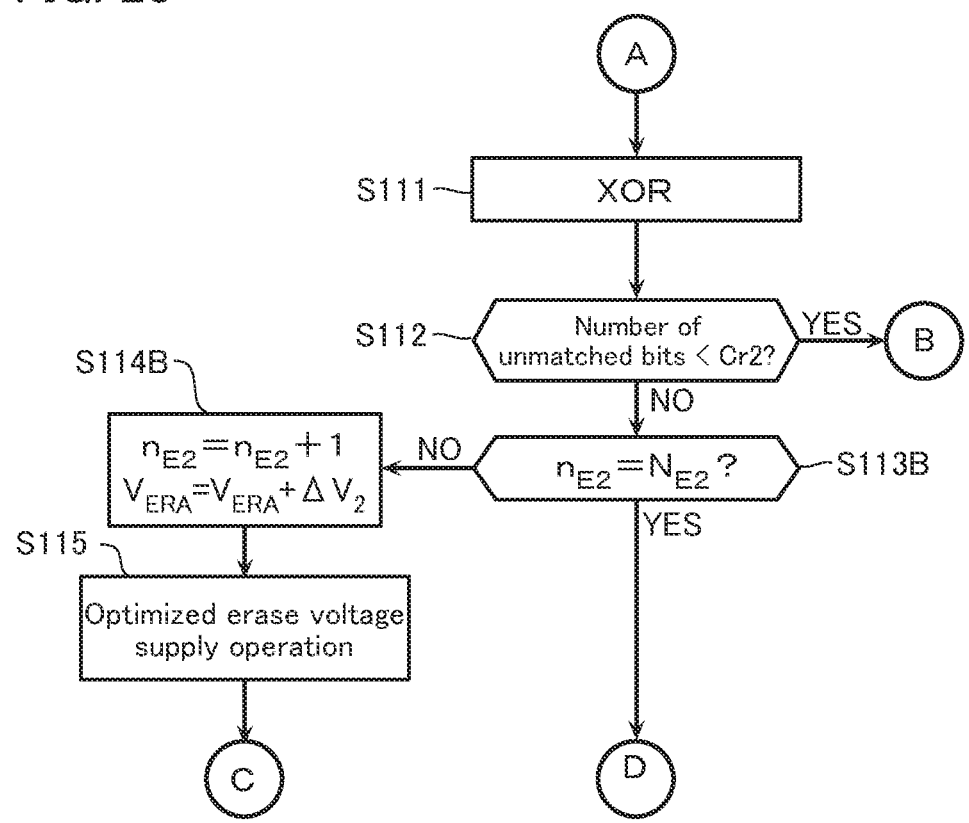
FIG. 23 is a flowchart for describing the erase operation of the memory die MD of the fourth embodiment.

FIG. 22 and FIG. 23 are flowcharts for describing an erase operation of a memory die MD in the fourth embodiment. In FIG. 22, after Step S101 of FIG. 9, Step S102 is added. In FIG. 23, Steps S113B, S114B are executed instead of Steps S113, S114 of FIG. 10.

For example, as illustrated in FIG. 22, in Step S102, a loop count $n_{E2}$ is set to 1. The loop count $n_{E2}$ is a variable indicating the number of erase loops different from that of the loop count $n_{E1}$.

In Step S113B, whether the loop count $n_{E2}$ has reached a predetermined count $N_{E2}$ or not is determined. When the loop count $n_{E2}$ has not reached the predetermined count $N_{E2}$, the process proceeds to Step S114B. When the loop count $n_{E2}$ has reached the predetermined count $N_{E2}$, the process proceeds to Step S109.

In Step S114B, 1 is added to the loop count $n_{E2}$. In Step S114B, an offset voltage $\Delta V_2$ is added to the erase voltage $V_{ERA}$. Therefore, the erase voltage $V_{ERA}$ increases by the offset voltage $\Delta V_2$ in each erase loop in accordance with the increase in the loop count $n_{E2}$.

In the first embodiment, upper limit counts of the number of execution (loop counts $n_{E1}$) of the erase voltage supply operation (Step S103) and the optimized erase voltage supply operation (Step S115) are $N_{E1}$ (Step S107, S113). In contrast to this, in the fourth embodiment, an upper limit count of the number of execution (loop count $n_{E1}$) of the erase voltage supply operation (Step S103) is $N_{E1}$ (Step S107), and an upper limit count of the number of execution (loop count $n_{E2}$) of the optimized erase voltage supply operation (Step S115) is $N_{E2}$ (Step S113B).

With this configuration, the number of execution (loop count $n_{E1}$) of the erase voltage supply operation (Step S103) and the number of execution (loop count $n_{E2}$) of the optimized erase voltage supply operation (Step S115) can be separately controlled.

Fifth Embodiment

Figure 24:
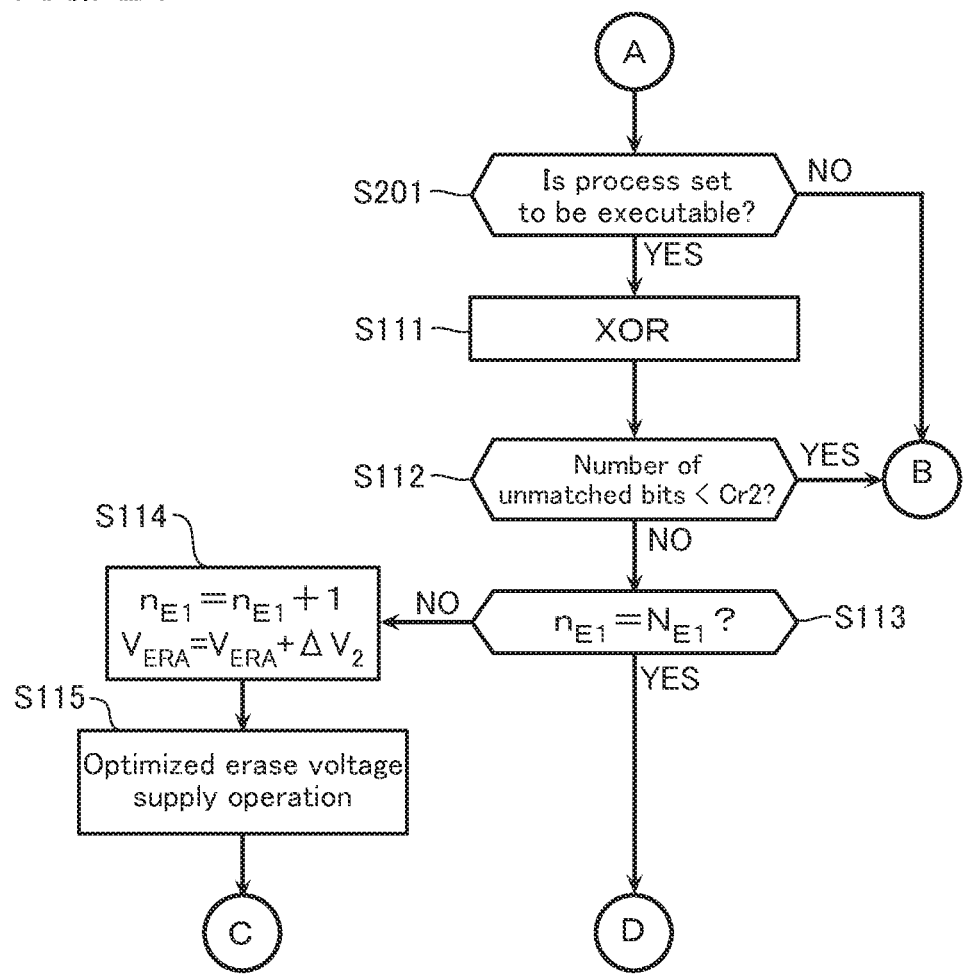
FIG. 24 is a flowchart for describing an erase operation of a memory die MD of a fifth embodiment.

FIG. 24 is a flowchart for describing an erase operation of a memory die MD of the fifth embodiment. In FIG. 24, Step S201 is added before Step S111 of FIG. 10.

In the fifth embodiment, a user can set the calculation of the exclusive OR (XOR) (Step S111), the determination of the number of unmatched bits (Step S112), and the optimized erase voltage supply operation (Step S115) to be executable/inexecutable. For example, the host computer 20 transmits data indicating executable/inexecutable to the controller die CD. The controller die CD transmits the data indicating executable/inexecutable from the host computer 20 to the memory die MD. In the memory die MD, when the input/output control circuit I/O inputs the data indicating executable/inexecutable, the data is output to, for example, the sequencer SQC. The sequencer SQC stores the data indicating executable/inexecutable in a predetermined register.

In Step S201, the sequencer SQC determines whether the process is set to be executable or not based on the data indicating executable/inexecutable. When the process is determined to be set to be executable, the processes of Step S111 and the following Steps are executed. When the process is determined not to be set to be executable (set to be inexecutable), the process proceeds to Step S110 without executing the processes of Step S111 and the following Steps.

With this configuration, the calculation of the exclusive OR (XOR) (Step S111), the determination of the number of unmatched bits (Step S112), and the optimized erase voltage supply operation (Step S115) can be set to be executable/inexecutable corresponding to the usage condition of the memory system 10 by the user. A configuration in which the user can set the optimized erase voltage supply operation (Step S115) to be executable/inexecutable may be employed.

Other Embodiments

The semiconductor memory devices according to the embodiments have been described above. However, the above-described explanations are merely examples, and the configurations, the methods, and the like described above can be appropriately adjusted.

For example, in the execution of the erase voltage supply operation and the optimized erase voltage supply operation in the first embodiment to the fifth embodiment, the example in which the erase voltage $V_{ERA}$ is applied to both the bit line BL and the source line SL is described. However, when the erase voltage supply operation and the optimized erase voltage supply operation are executed, the application of the erase voltage $V_{ERA}$ to one of the bit line BL and the source line SL may be omitted.

The configurations of the first embodiment to the fifth embodiment may be combined as necessary. For example, the optimized erase voltage supply operations of the first embodiment and the second embodiment may be combined. In this case, in the optimized erase voltage supply operation, the application period of the erase voltage $V_{ERA}$ is changed from the time period T1 to the time period T2, and the offset voltage $\Delta V_2$ is added to the erase voltage $V_{ERA}$ every time when the loop count $n_{E1}$ increases. The optimized erase voltage supply operations of the second embodiment and the third embodiment may be combined. In this case, in the optimized erase voltage supply operation, the application period of the erase voltage $V_{ERA}$ is changed from the time period T1 to the time period T2, the offset voltage $\Delta V_1$ is added to the erase voltage $V_{ERA}$ every time when the loop count $n_{E1}$ increases, and the voltage $V_{WLEr}$ applied to the even-numbered word line WLeven or the odd-numbered word line WLodd decreases by the offset voltage $\Delta V_{WL}$. The optimized erase voltage supply operations of the first embodiment to the third embodiment may be combined. In this case, in the optimized erase voltage supply operation, the application period of the erase voltage $V_{ERA}$ is changed from the time period T1 to the time period T2, the offset voltage $\Delta V_2$ is added to the erase voltage $V_{ERA}$ every time when the loop count $n_{E1}$ increases, and the voltage $V_{WLEr}$ applied to the even-numbered word line WLeven or the odd-numbered word line WLodd decreases by the offset voltage $\Delta V_{WL}$. Further, the first embodiment to the fourth embodiment may be combined, and the first embodiment to the fifth embodiment may be combined.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of conductive layers arranged in a first direction intersecting with a surface of the substrate;
   a first semiconductor layer that extends in the first direction and is opposed to the plurality of conductive layers;
   an electric charge accumulating layer disposed between the plurality of conductive layers and the first semiconductor layer;

a first wiring connected to one end portion in the first direction of the first semiconductor layer; and
a control circuit electrically connected to the plurality of conductive layers and the first wiring,
wherein:
the control circuit is configured to be able to perform an erase operation,
the erase operation includes a plurality of erase loops,
each of the plurality of erase loops includes:
   an erase voltage supply operation that applies an erase voltage to the first wiring;
   a first erase verify operation that applies a read pass voltage smaller than the erase voltage to a first conductive layer among the plurality of conductive layers, and applies an erase verify voltage smaller than the read pass voltage to a second conductive layer among the plurality of conductive layers after performing the erase voltage supply operation; and
   a second erase verify operation that applies the erase verify voltage to the first conductive layer, and applies the read pass voltage to the second conductive layer after performing the first erase verify operation,
the erase voltage increases by a first offset voltage in each erase loop from a first erase loop to an a-th erase loop, where a is an integer of 2 or more,
the erase voltage increases by a second offset voltage in each erase loop from an a+1-th erase loop to a b-th erase loop, where b is an integer of a+2 or more,
the second offset voltage is larger than the first offset voltage,
the erase voltage is applied to the first wiring for a first application period in each erase loop from the first erase loop to the a-th erase loop,
the erase voltage is applied to the first wiring for a second application period in each erase loop from the a+1-th erase loop to the b-th erase loop, and
the second application period is longer than the first application period.

2. A semiconductor memory device comprising:
a substrate;
a plurality of conductive layers arranged in a first direction intersecting with a surface of the substrate;
a first semiconductor layer that extends in the first direction and is opposed to the plurality of conductive layers;
an electric charge accumulating layer disposed between the plurality of conductive layers and the first semiconductor layer;
a first wiring connected to one end portion in the first direction of the first semiconductor layer; and
a control circuit electrically connected to the plurality of conductive layers and the first wiring,
wherein:
the control circuit is configured to be able to perform an erase operation,
the erase operation includes a plurality of erase loops,
each of the plurality of erase loops includes:
   an erase voltage supply operation that applies an erase voltage to the first wiring;
   a first erase verify operation that applies a read pass voltage smaller than the erase voltage to a first conductive layer among the plurality of conductive layers, and applies an erase verify voltage smaller than the read pass voltage to a second conductive layer among the plurality of conductive layers after performing the erase voltage supply operation; and
   a second erase verify operation that applies the erase verify voltage to the first conductive layer, and applies the read pass voltage to the second conductive layer after performing the first erase verify operation,
the erase voltage increases by a first offset voltage in each erase loop from a first erase loop to an a-th erase loop, where a is an integer of 2 or more,
the erase voltage increases by a second offset voltage in each erase loop from an a+1-th erase loop to a b-th erase loop, where b is an integer of a+2 or more,
the second offset voltage is larger than the first offset voltage,
in the erase voltage supply operation from the first erase loop to the a-th erase loop, a first voltage smaller than the erase voltage is applied to the first conductive layer and the second conductive layer, and
in the erase voltage supply operation from the a+1-th erase loop to the b-th erase loop, the first voltage is applied to one of the first conductive layer and the second conductive layer, and a second voltage smaller than the first voltage is applied to the other of the first conductive layer and the second conductive layer.

3. A semiconductor memory device comprising:
a substrate;
a plurality of conductive layers arranged in a first direction intersecting with a surface of the substrate;
a first semiconductor layer that extends in the first direction and is opposed to the plurality of conductive layers;
an electric charge accumulating layer disposed between the plurality of conductive layers and the first semiconductor layer;
a first wiring connected to one end portion in the first direction of the first semiconductor layer; and
a control circuit electrically connected to the plurality of conductive layers and the first wiring,
wherein:
the control circuit is configured to be able to perform an erase operation,
the erase operation includes a plurality of erase loops,
each of the plurality of erase loops includes:
   an erase voltage supply operation that applies an erase voltage to the first wiring;
   a first erase verify operation that applies a read pass voltage smaller than the erase voltage to a first conductive layer among the plurality of conductive layers, and applies an erase verify voltage smaller than the read pass voltage to a second conductive layer among the plurality of conductive layers after performing the erase voltage supply operation; and
   a second erase verify operation that applies the erase verify voltage to the first conductive layer, and applies the read pass voltage to the second conductive layer after performing the first erase verify operation,
the erase voltage increases by a first offset voltage in each erase loop from a first erase loop to an a-th erase loop, where a is an integer of 2 or more,
the erase voltage increases by a second offset voltage in each erase loop from an a+1-th erase loop to a b-th erase loop, where b is an integer of a+2 or more,
the second offset voltage is larger than the first offset voltage, and
when data obtained by the first erase verify operation is first result data, and data obtained by the second erase verify operation is second result data, each of the first result data and the second result data includes first data corresponding to a bit of erase pass and second data corresponding to a bit of erase fail, and each of the plurality of erase loops includes at least one of (i) a first determination operation that determines whether or not each of counts of the second data included in the first result data and the second result data is less than a first reference value, or (ii) a second determination operation that determines whether or not a count of unmatched bits between the first result data and the second result data is less than a second reference value.

4. The semiconductor memory device according to claim 3, wherein:
the first determination operation compares the count of the second data included in the first result data with the count of the second data included in the second result data, and
when the count of the second data corresponding to one of the plurality of third conductive layers and the plurality of fourth conductive layers is large, the erase voltage supply operation applies a first voltage smaller than the erase voltage to the other of the plurality of third conductive layers and the plurality of fourth conductive layers, and applies a second voltage smaller than the first voltage to the one of the plurality of third conductive layers and the plurality of fourth conductive layers.

5. The semiconductor memory device according to claim 3, wherein the control circuit includes:
an arithmetic circuit that calculates an exclusive OR of the first result data and the second result data; and
a counter that counts data of the arithmetic circuit.

6. The semiconductor memory device according to claim 5, wherein:
the exclusive OR includes third data corresponding to a matched bit and fourth data corresponding to an unmatched bit between the first result data and the second result data, and
the counter determines whether or not a count of the fourth data included in the exclusive OR is less than a third reference value.

* * * * *